(12) United States Patent
Cheng et al.

(10) Patent No.: US 12,543,325 B2
(45) Date of Patent: Feb. 3, 2026

(54) THREE-DIMENSIONAL SEMICONDUCTOR DEVICES

(71) Applicant: Macronix International Co., Ltd., Hsinchu (TW)

(72) Inventors: Chen-Yu Cheng, Hsinchu (TW); Tzung-Ting Han, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 512 days.

(21) Appl. No.: 18/307,402

(22) Filed: Apr. 26, 2023

(65) Prior Publication Data
US 2024/0365568 A1 Oct. 31, 2024

(51) Int. Cl.
| H10B 80/00 | (2023.01) |
| H01L 23/00 | (2006.01) |
| H01L 25/065 | (2023.01) |
| H10B 43/27 | (2023.01) |
| H10B 43/40 | (2023.01) |

(52) U.S. Cl.
CPC ............ *H10B 80/00* (2023.02); *H01L 24/08* (2013.01); *H01L 25/0657* (2013.01); *H10B 43/27* (2023.02); *H10B 43/40* (2023.02); *H01L 2224/08145* (2013.01); *H01L 2924/1431* (2013.01); *H01L 2924/14511* (2013.01)

(58) Field of Classification Search
CPC ..................... H01L 25/50; H01L 24/08; H01L 2224/08145; H10B 43/50
See application file for complete search history.

(56) References Cited

U.S. PATENT DOCUMENTS

| 6,864,565 | B1 * | 3/2005 | Hool ..................... H01L 23/525 |
| | | | 257/E23.07 |
| 9,312,241 | B2 * | 4/2016 | Aritome ........... H01L 21/76898 |
| 10,608,638 | B2 | 3/2020 | Lee et al. |
| 11,107,802 | B2 | 8/2021 | Nakaki |
| 11,127,728 | B2 * | 9/2021 | Zhou ...................... G11C 16/30 |
| 2008/0296763 | A1 * | 12/2008 | Chen ................. H01L 21/76898 |
| | | | 257/738 |
| 2021/0383874 | A1 | 12/2021 | Oh et al. |
| 2022/0051983 | A1 | 2/2022 | Kim et al. |

(Continued)

FOREIGN PATENT DOCUMENTS

| TW | 200534287 | 10/2005 |
| TW | 200832422 | 8/2008 |

(Continued)

*Primary Examiner* — Thao P Le
(74) *Attorney, Agent, or Firm* — Fish & Richardson P.C.

(57) ABSTRACT

Methods, systems and apparatus for three-dimensional (3D) memory devices are provided. In one aspect, a semiconductor device includes: an array-side structure and a device-side structure. The array-side structure includes a memory array of memory cells and an array-side integrated circuit conductively coupled to the memory array. The device-side structure includes a device-side integrated circuit. The array-side structure and the device-side structure are integrated together with one or more connection pads therebetween. The array-side integrated circuit and the device-side integrated circuit are conductively coupled to each other through at least one of the one or more connection pads and configured to perform one or more operations on the memory array.

26 Claims, 14 Drawing Sheets

(56) References Cited

U.S. PATENT DOCUMENTS

| | | | |
|---|---|---|---|
| 2023/0031430 A1* | 2/2023 | Liu | H01L 21/565 |
| 2023/0207504 A1* | 6/2023 | Shao | H01L 25/50 |
| | | | 257/777 |
| 2023/0422504 A1* | 12/2023 | Lu | H01L 23/5283 |
| 2024/0057333 A1* | 2/2024 | Choi | H10B 80/00 |
| 2024/0074171 A1* | 2/2024 | Tsutsumi | H10B 41/27 |
| 2024/0096850 A1* | 3/2024 | Pachamuthu | H01L 25/0657 |
| 2024/0138157 A1* | 4/2024 | Kim | H10B 41/10 |
| 2024/0188310 A1* | 6/2024 | Saito | H10B 43/27 |
| 2024/0243061 A1* | 7/2024 | Moriyama | H01L 23/5226 |
| 2024/0422975 A1* | 12/2024 | Jung | H10B 43/10 |
| 2025/0079258 A1* | 3/2025 | Kim | H01L 24/73 |
| 2025/0294746 A1* | 9/2025 | Kanamori | H10B 43/35 |

FOREIGN PATENT DOCUMENTS

| | | |
|---|---|---|
| TW | 201430844 | 8/2014 |
| TW | 202018901 | 5/2020 |
| TW | 202034514 | 9/2020 |
| TW | 202103306 A | 1/2021 |
| TW | 202218127 A | 5/2022 |

* cited by examiner

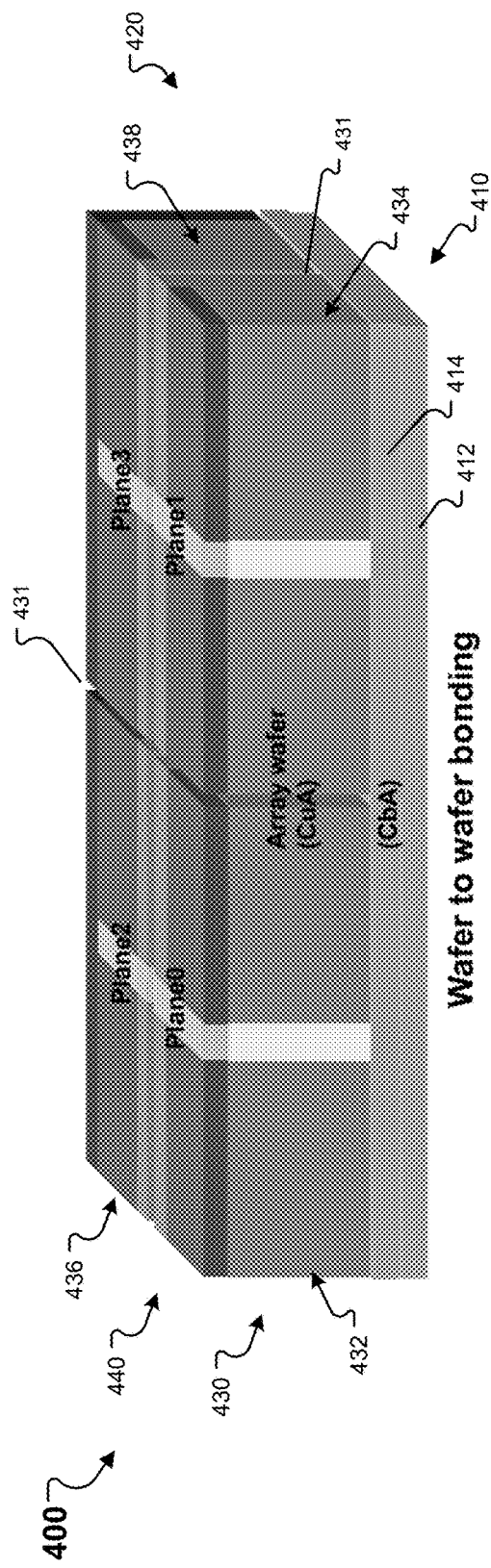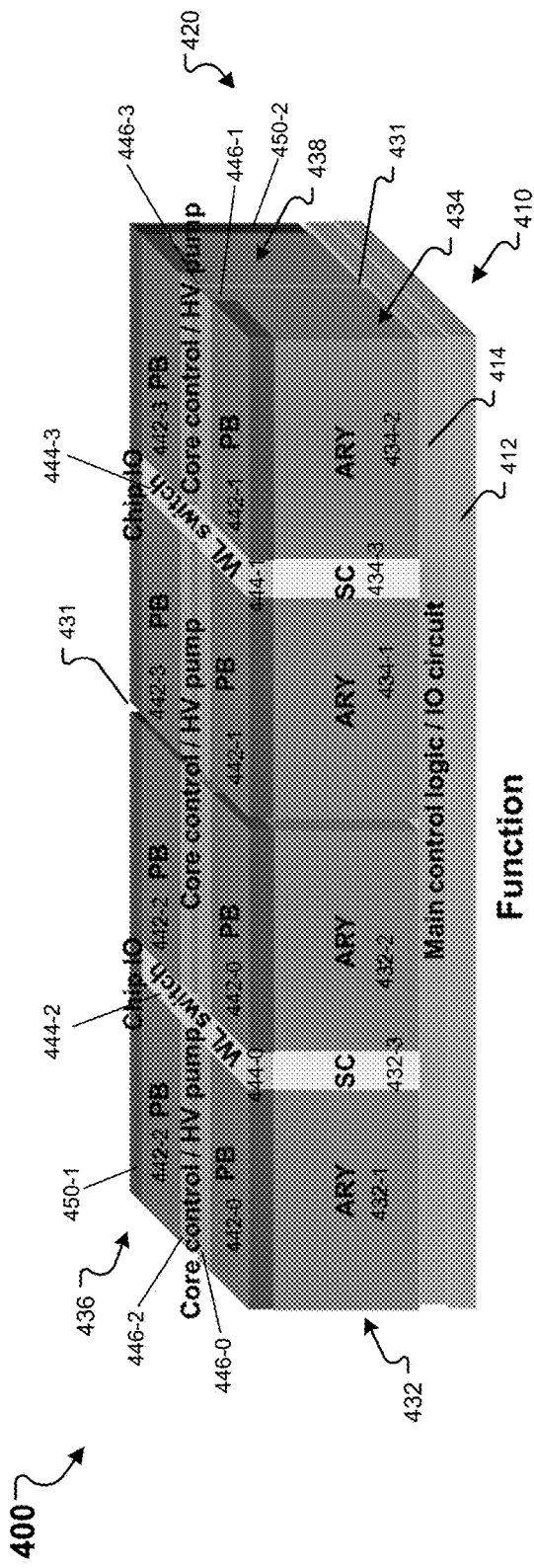

THREE-DIMENSIONAL SEMICONDUCTOR DEVICES

BACKGROUND

Semiconductor devices, e.g., high-density NAND flash memory devices, can have various structures to increase a density of memory cells and lines on a chip. For example, three-dimensional (3D) NAND structures are attractive due to their capability to increase an array density by stacking more layers within a similar footprint. However, as more layers are stacked in a same area, it can be challenging to provide corresponding circuits for the layers.

SUMMARY

The present disclosure describes methods, systems, and techniques for developing three-dimensional (3D) semiconductor devices, e.g., 3D memory devices.

One aspect of the present disclosure features a semiconductor device including an array-side structure and a device-side structure. The array-side structure includes: a memory array of memory cells, and an array-side integrated circuit conductively coupled to the memory array. The device-side structure includes a device-side integrated circuit. The array-side structure and the device-side structure are integrated together with one or more connection pads therebetween. The array-side integrated circuit and the device-side integrated circuit are conductively coupled to each other through at least one of the one or more connection pads and configured to perform one or more operations on the memory array.

In some embodiments, the one or more operations include one or more of a write operation, a read operation, a programming operation, an erasing operation, and a search operation.

In some embodiments, the array-side integrated circuit includes one or more first logics or circuits, and the device-side integrated circuit includes one or more second logics or circuits having at least one of a higher operation speed or a higher thermal sensitivity than the one or more first logics or circuits.

In some embodiments, the array-side integrated circuit includes one or more first logics or circuits configured for one or more local operations on the memory array, and the device-side integrated circuit includes one or more second logics or circuits configured for at least one of one or more global operations for the semiconductor device or communication with one or more external devices.

In some embodiments, the array-side integrated circuit includes at least one of a core control logic, a sense amplifier or a page buffer circuit, a word line decoder, or a high voltage charge pump. The device-side integrated circuit includes at least one of a main control logic, a data buffer, a cache, a clock generator, a data path, an input/output (I/O) circuit, a computer-in-memory (CIM) logic, or one or more peripheral circuits.

In some embodiments, the semiconductor device includes a first semiconductor chip including the array-side structure and a second semiconductor chip including the device-side structure. The first semiconductor chip has a first layer including first bonding pads, and the second semiconductor chip has a second layer including second bonding pads. The first semiconductor chip and the second semiconductor chip are bonded together by the first bonding pads in the first layer bonded with the second bonding pads in the second layer, the bonded first bonding pads and second bonding pads including the one or more connection pads.

In some embodiments, each of the first semiconductor chip and the second semiconductor chip is a CMOS chip, and the first semiconductor chip is formed by a CMOS under array (CuA) process, and the first semiconductor chip and the second semiconductor chip are integrated together by a CMOS bonding Array (CbA) process.

In some embodiments, the memory array includes: a three-dimensional (3D) array structure including: a plurality of conductive layers separated from each other by insulating layers, and a plurality of vertical channels being arranged orthogonally through the plurality of conductive layers and the insulating layers, each of the plurality of vertical channels including a string of memory cells; a stepped structure configured to individually expose the plurality of conductive layers; and a plurality of conductive channels through the stepped structure, where each of the plurality of conductive layers is configured to be conductively connected to the array-side integrated circuit by a corresponding conductive channel of the plurality of conductive channels.

In some embodiments, the array-side integrated circuit includes: a word line decoder and a core control logic conductively coupled to the word line decoder. The memory array further includes: one or more first through array contacts (TACs) through the memory array having a first TAC conductively coupled between the word line decoder and the plurality of conductive channels, and one or more second through array contacts (TACs) through the memory array having a second TAC conductively coupled between the core control logic and a main control logic in the device-side integrated circuit.

In some embodiments, the memory array further includes: one or more common source layers on a first side of the 3D array structure and a plurality of bit lines on a second side of the 3D array structure. The array-side integrated circuit is formed adjacent to the one or more common source layers on the first side of the 3D array structure, and the device-side integrated circuit is formed adjacent to the plurality of bit lines on the second side of the 3D array structure. The array-side integrated circuit includes a sense amplifier or a page buffer circuit conductively coupled to the plurality of bit lines through another second TAC of the one or more second TACs.

In some embodiments, the 3D array structure includes a first subarray structure and a second subarray structure with the stepped structure therebetween, and the word line decoder is arranged on top of the stepped structure and between the first subarray structure and the second subarray structure.

In some embodiments, the array-side integrated circuit further includes: a sense amplifier or a page buffer circuit conductively coupled to the memory array and the core control logic, and a high voltage charge pump conductively coupled to the core control logic. The sense amplifier or the page buffer circuit, the core control logic, and the high voltage charge pump are arranged on top of the 3D array structure.

In some embodiments, the 3D array structure further includes: a plurality of dielectric layers extending from the plurality of conductive layers and being separated by the insulating layers. The one or more second TACs are through the plurality of dielectric layers and the insulating layers. The memory array further includes one or more third TACs through the plurality of dielectric layers and the insulating layers and configured to conductively couple the device-side integrated circuit to one or more input/output (I/O) conductive pads for connection with at least one of an external controller or an external power source.

In some embodiments, the array-side structure includes a first semiconductor substrate, and the array-side integrated circuit is formed on a first side of the first semiconductor substrate and the memory array is formed on the array-side integrated circuit. The device-side structure includes a second semiconductor substrate, and the device-side integrated circuit is formed on the second semiconductor substrate. The one or more connection pads are between the device-side integrated circuit and the memory array.

In some embodiments, the semiconductor device further includes one or more input/output (I/O) conductive pads formed on a second side of the first semiconductor substrate, the second side being opposite to the first side, and the device-side integrated circuit is conductively coupled to the one or more I/O conductive pads through a conductive via through the first semiconductor substrate and a through-array contact (TAC) through the memory array.

In some embodiments, the semiconductor device includes a plurality of array-side structure including the array-side structure. The plurality of array-side structures are integrated on the device-side structure by respective connection pads, and each of the plurality of array-side structures is independently conductively coupled to the device-side integrated circuit through at least one respective connection pad.

In some embodiments, a number of the plurality of array-side structures is an even number.

In some embodiments, each of the plurality of array-side structures includes a respective plane having a plurality of blocks.

In some embodiments, the plurality of array-side structures are formed on a semiconductor substrate.

Another aspect of the present disclosure features a semiconductor device including: a device-side structure including a device-side integrated circuit extending along a first direction; and multiple stacks of array-side structures sequentially arranged on the device-side structure along a second direction perpendicular to the first direction. Each stack of the multiple stacks includes at least one array-side structure including: a memory array of memory cells and an array-side integrated circuit conductively coupled to the memory array. The array-side integrated circuit is conductively coupled to the device-side integrated circuit and configured to perform one or more operations on the memory array.

In some embodiments, the multiple stacks include: a first stack including a first semiconductor substrate, a first array-side integrated circuit formed on the first semiconductor substrate, and a first memory array formed on the first array-side integrated circuit, and a second stack including a second semiconductor substrate, a second array-side integrated circuit formed on the second semiconductor substrate, and a second memory array formed on the first array-side integrated circuit. The first stack is integrated with the device-side structure by one or more first bonding pads between the first memory array and the device-side integrated circuit, and the second stack is integrated with the first stack by one or more second bonding pads between the second memory array and the first semiconductor substrate.

In some embodiments, the first array-side integrated circuit is conductively coupled to the device-side integrated circuit by one or more first through-array contact (TACs) through the first memory array, and the second array-side integrated circuit is conductively coupled to the device-side integrated circuit by one or more second TACs through the second memory array, a conductive via through the first semiconductor substrate, and one or more other first TACs through the first memory array.

In some embodiments, the semiconductor device further includes an input/output (I/O) structure on top of the multiple stacks along the second direction. The I/O structure includes one or more input/output (I/O) conductive pads conductively coupled to the device-side integrated circuit and configured for conductive connection with at least one of an external controller or an external power source.

In some embodiments, the I/O structure includes a protective layer on top of the one or more I/O conductive pads, the protective layer being a top layer of the semiconductor device.

A further aspect of the present disclosure features a semiconductor device including: a memory device including one or more memory chips and a memory controller conductively coupled to each of the one or more memory chips. Each of the one or more memory chips includes: an array-side structure including a memory array of memory cells and an array-side integrated circuit conductively coupled to the memory array, and a device-side structure including a device-side integrated circuit. The array-side structure and the device-side structure are integrated together with one or more connection pads therebetween. The array-side integrated circuit and the device-side integrated circuit are conductively coupled to each other through at least one of the one or more connection pads and configured to perform one or more operations on the memory array.

In some embodiments, each of the one or more memory chips includes a plurality of array-side structures integrated on the device-side structure by respective conductive pads. Each of the plurality of array-side structures is independently conductively coupled to the device-side integrated circuit through at least one respective conductive pad. Each of the plurality of memory chips includes a respective input/output (I/O) interface configured for communication between the device-side integrated circuit of the memory chip and the memory controller.

In the present disclosure, the term "logic" represents one or more logic circuits that each can include one or more logic gates or any structure formed from logic gates. A logic gate can be e.g., Buffer, NOT (or inverter), AND, OR, NAND, NOR, XOR, or XNOR. The term "circuit" represents one or more logic circuits, digital circuits, and/or analog circuits, and can include one or more logic gates, one or more digital components, one or more analog components, or any combination thereof.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIGS. 4A-4C illustrate an example integrated 3D memory chip having multiple planes.

Like reference numbers and designations in the various drawings indicate like elements. It is also to be understood that the various exemplary implementations shown in the figures are merely illustrative representations and are not necessarily drawn to scale.

DETAILED DESCRIPTION

With increasing layers of 3D semiconductor devices, e.g., 3D NAND memory devices, a chip size can become smaller to keep a same device capacity. Peripheral circuits for the layers can be fabricated as a Complementary metal-oxide-semiconductor (CMOS) circuit. During a CMOS under Array (CuA) process, the CMOS circuit can be formed under the memory array on a same semiconductor substrate (e.g., a silicon wafer). During a CMOS bonding Array (CbA) process, the memory array and the CMOS circuit are formed on separate semiconductor chips that can be later bonded together to form an integrated memory device. For both of CMOS under Array (CuA) process and CMOS bonding Array (CbA) process, an area of the CMOS circuit can be same as an area of the memory array to prevent waste of an area of the semiconductor substrate.

Implementations of the present disclosure provide techniques for developing 3D semiconductor devices (e.g., 3D NAND memory devices), for example by separating and forming circuits (e.g., peripheral circuits) for memory arrays on at least two semiconductor chips that are later integrated together. The techniques can adopt both of CMOS under Array (CuA) process and CMOS bonding Array (CbA) process.

In some implementations, the circuits for the memory array can be divided based on whether a logic or circuit individually functions locally for a plane at a plane level or globally for the memory device at a device level. In some implementations, the circuits for the memory array can be divided based on whether a logic or circuit is configured for a high operation speed and/or has a high thermal sensitivity. If the logic or circuit (e.g., an input/output (I/O) circuit) has a high operation speed (e.g., for large throughput) and/or has a high thermal sensitivity (or low thermal budget), the logic or circuit can be formed as a device-level circuit, e.g., on a separate CMOS chip. If the logic or circuit does not have a high operation speed, has a low thermal sensitivity (or high thermal budget), and/or is for an individual plane, the logic or circuit can be formed as a plane-level circuit, e.g., under the memory array of the plane in a semiconductor chip. For example, a high voltage (HV) circuit (e.g., HV charge pump) can be located on a semiconductor chip having the memory array, which can help simplify a process flow in the separate CMOS chip. In some implementations, a logic or circuit can be formed as either a plane-level circuit (or plane-related circuit) or a device-level circuit (or device-related circuit). In some implementations, a logic or circuit can have a first portion formed as a plane-level circuit and a second portion formed as a device-level circuit.

Figure 3:
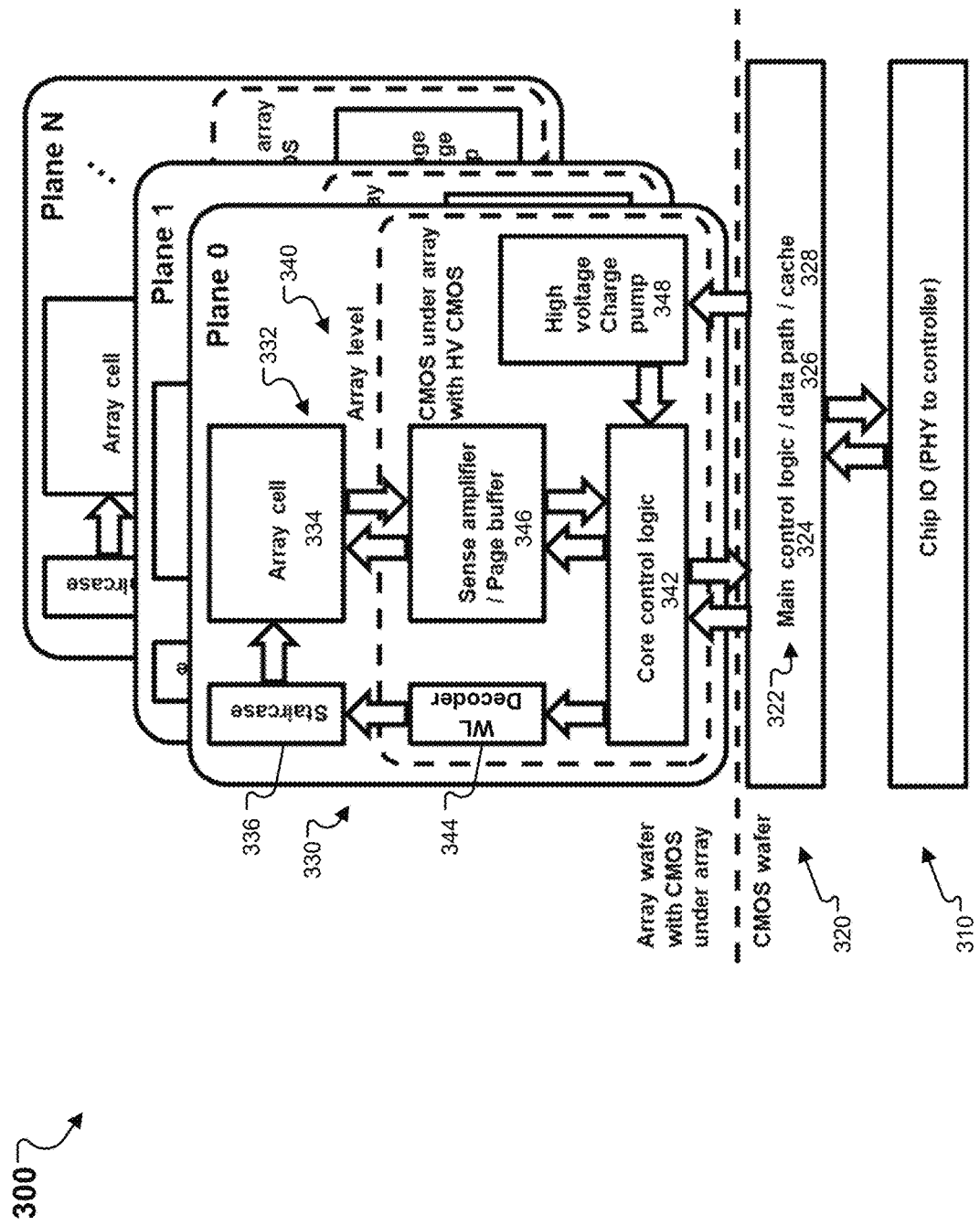
FIG. 3 illustrates an example of an integrated memory chip.

In some examples, e.g., as illustrated with further details in FIG. 3, a plane-side (plane-level or plane-related) integrated circuit includes one or more plane-side (plane-level or plane-related) circuits, e.g., a word line decoder, a page buffer circuit, a sense amplifier, a core control logic, and/or a high voltage charge pump. A device-side (device-level or device-related) integrated circuit can include one or more device-side (device-level or device-related) circuits, e.g., a main control logic, a data path, an input/output (I/O) circuit, a buffer, a computer-in-memory (CIM) logic, a clock generator, and/or one or more other peripheral circuits.

A plane includes a memory array plane of memory cells. The terms "plane-side" and "array-side" can be used interchangeably. The plane-side (or array-side) integrated circuit can be formed under the plane (or the memory array) on a semiconductor substrate, e.g., a silicon wafer, according to a CuA process to obtain an integrated plane module. The device-side integrated circuit can be formed on a separate semiconductor substrate, e.g., a silicon wafer, to obtain a device-side semiconductor chip (e.g., a CMOS chip). Then, one or more integrated plane modules can be integrated on the device-side semiconductor chip, e.g., according to a CbA process, to form a memory device (e.g., a 3D memory chip).

In some implementations, e.g., as illustrated with further details in FIGS. 4A-4C, 5, and 6A-6D, a 3D memory chip (e.g., a 3D NAND memory chip) can be separated into three parts that can be stacked together with a same area. For example, a top part can include plane relative circuits, a middle part can include one or more planes (or memory arrays) and associated staircases, and a bottom part can include device relative circuits (e.g., a main control logic and I/O circuit). That is, both of the top part and the bottom part are circuits for the middle part (memory arrays such as NAND arrays). In this architecture, a total array area can be a half of a total circuit area. Accordingly, a chip size can become smaller, e.g., to a half, compared to a normal architecture having just one integrated circuit for the memory array formed by either CuA process or CbA process.

At a function level, each plane is controlled by an individual plane-side integrated circuit. Besides, most of plane-side circuits are integrated under a plane array to form an integrated plane module on a semiconductor substrate, e.g., according to a CuA process. Moreover, the device-side integrated circuit (e.g., a main control circuit, a data path, a chip I/O circuit, and/or any other circuits with low thermal budget) can be located in another semiconductor substrate. The device-side integrated circuit (e.g., the main control circuit and the chip IO circuit) can control each plane and provide supply to each plane. The device-side integrated circuit can also communicate with a controller external to the memory chip (e.g., receive a command from the controller or handle data transfer between the controller and each plane). In a physical structure, the semiconductor chip (or wafer) which has the one or more integrated plane modules can be bonded with the semiconductor chip (e.g., CMOS wafer) which has the device-side integrated circuit (e.g., the main control circuit and the chip I/O circuit). As the number of circuits integrated in the plane-side integrated circuit and/or the device-side integrated circuit is smaller than the number of circuits integrated in a single integrated circuit for the memory array, the techniques allow to minimize an area of a plane to be small as the plane-side integrated circuit and to minimize an area of the memory chip to be small as the device-side integrated circuit.

Figure 7A:
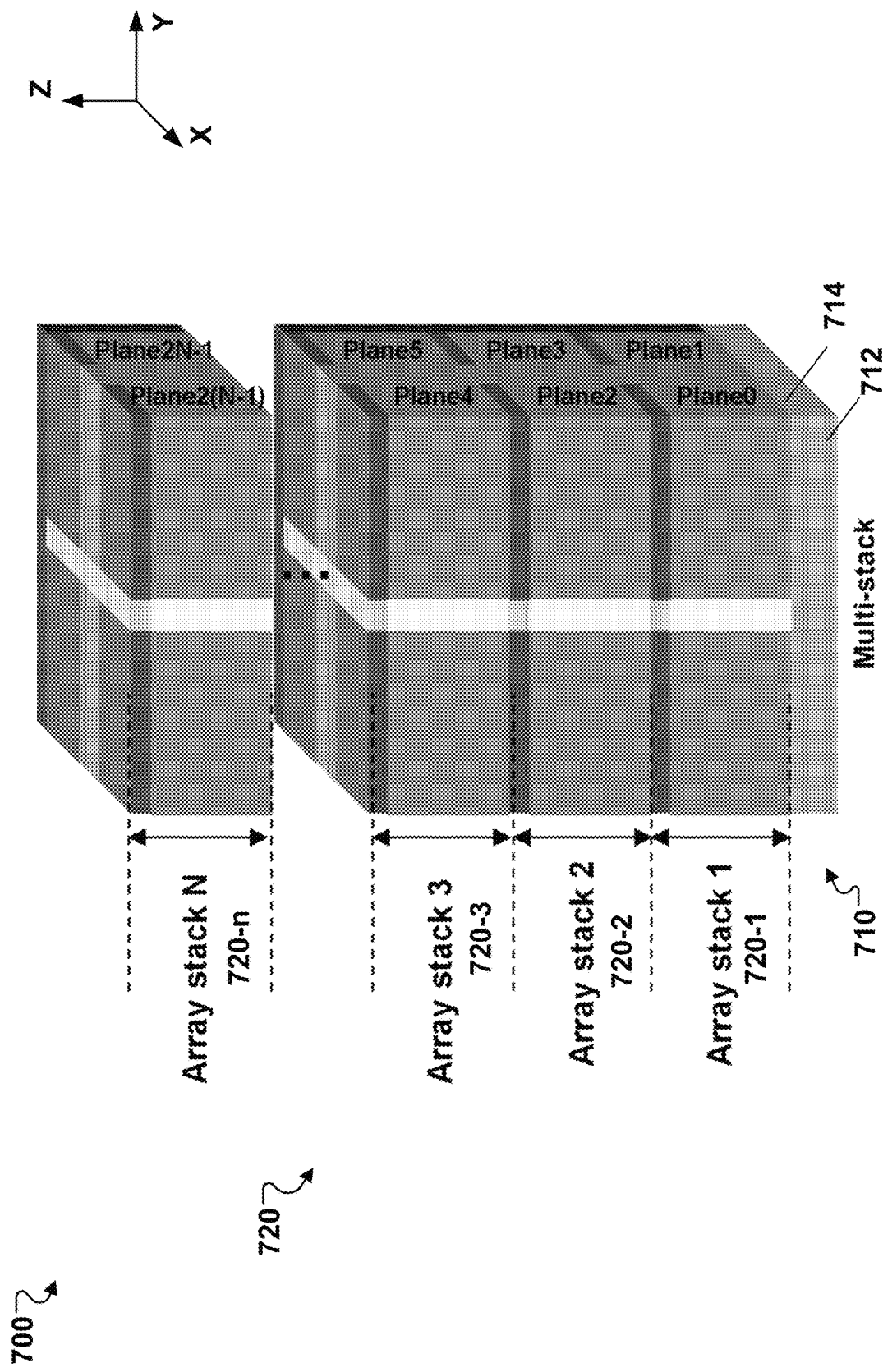
FIG. 7A illustrates an example integrated 3D memory chip including a multi-stack array structure.
Figure 7B:
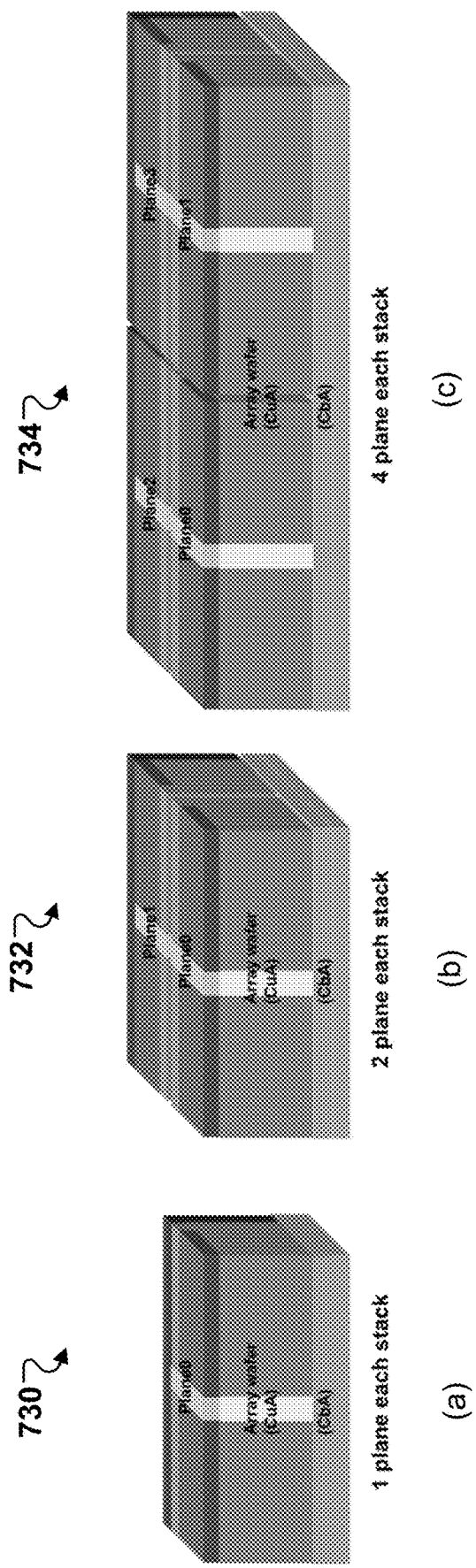
FIG. 7B illustrates example single array stacks having different numbers of planes.
Figure 8:
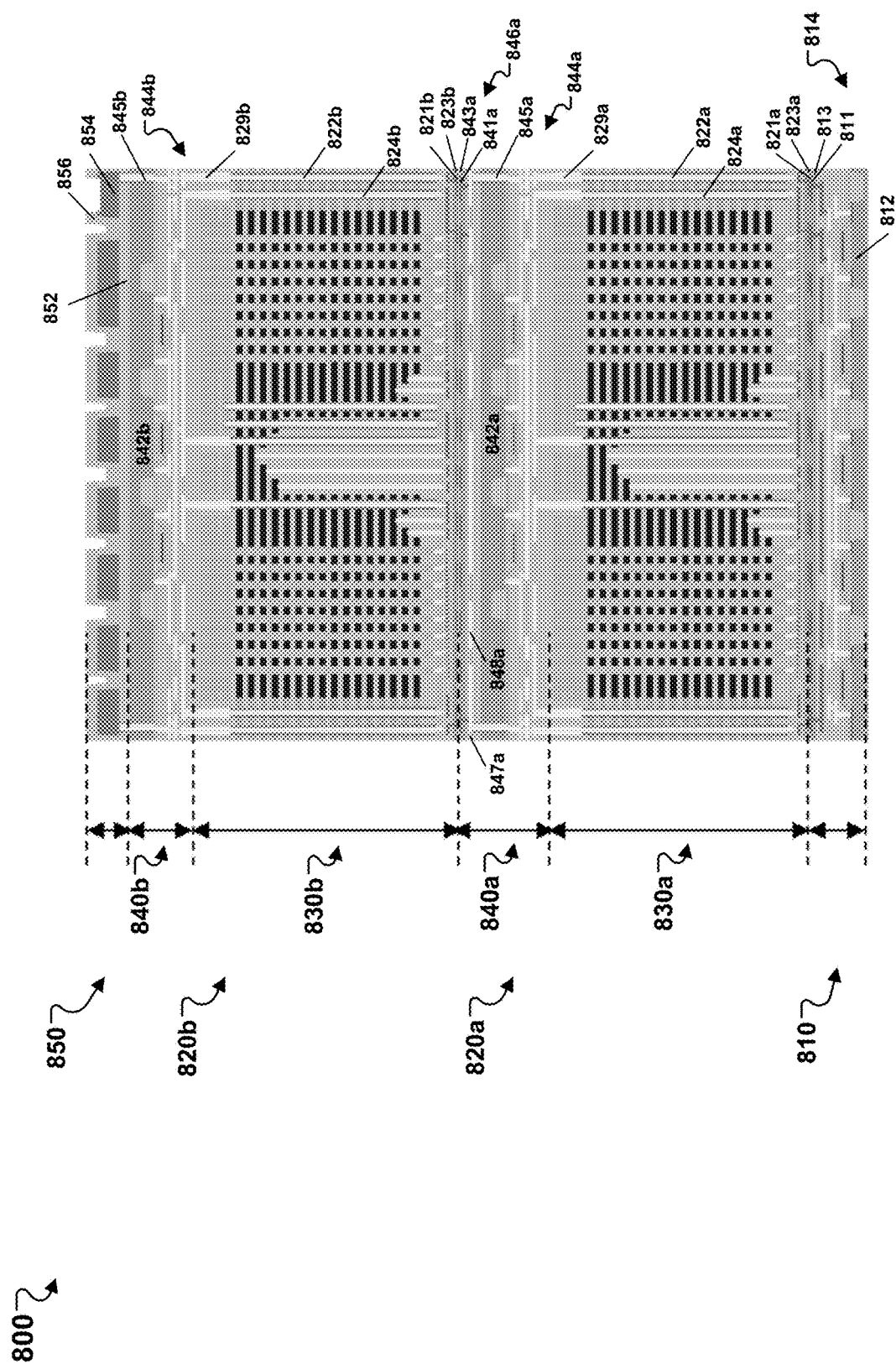
FIG. 8 illustrates a cross-section diagram of an example integrated 3D memory chip including two array stacks.

In some implementations, e.g., as illustrated with further details in FIGS. 7A-7B and 8, multiple stacks of array-side structures (e.g., a CMOS chip having memory arrays) can be sequentially arranged one by one on a single device-side structure (e.g., a separate CMOS chip) along a vertical direction to form a memory chip. Each stack can include one or more planes with corresponding plane-side integrated circuits. The number of planes in each stack can be flexible, e.g., 1, 2, or 4. This architecture enables to further increase the device capacity of the memory chip within a small area same as a device-side integrated circuit in the single device-side structure. The area of the memory chip can be only slightly affected by a number of total planes in the memory chip.

In some implementations, as the separate CMOS chip can achieve high speed, the techniques enable to integrate a Computing-in-Memory (CIM) logic or circuit in the memory chip to eliminate data transfer overhead in high efficiency computing. The techniques can also integrate other functional logics or circuits, e.g., content-addressable-memory (CAM), in the memory chip.

The techniques disclosed herein facilitate formation of corresponding circuits (e.g., peripheral circuits) in separated semiconductor chips that are to be integrated later, which can simplify the process, and improve the quality and performance of the integrated memory chip. For example, separating the chip I/O circuit (e.g., having a high thermal sensitivity) from the 3D memory array can avoid the chip I/O circuit be affected by sequential fabrication processes in forming the 3D memory array. Also, the 3D memory array can achieve a higher density with more layers on a same or smaller area, without limitation of a required area of the total peripheral circuits for the 3D memory array, as the total peripheral circuits can be accommodated in separate semiconductor chips.

The techniques disclosed herein can be applied to any 3D array structure or formation. The techniques can be compatible with typical memory storage systems (e.g., 3D NAND flash memory). The techniques can be applied to various types of non-volatile memory devices such as 3D NAND flash memory devices (e.g., floating-gate (FG) type or charge-trap (CT) type), NOR flash memory devices, erasable programmable read-only memory (EPROM), Ferroelectric Random Access Memory (FeRAM), Resistive Random Access Memory (ReRAM), Magnetoresistive random-access memory (MRAM), among others. The techniques can be applied to various memory types, such as SLC (single-level cell) devices, MLC (multi-level cell) devices like 2-level cell devices, TLC (triple-level cell) devices, QLC (quad-level cell) devices, or PLC (penta-level cell) devices. Additionally or alternatively, the techniques can be applied to various types of devices and systems, such as secure digital (SD) cards, embedded multimedia cards (eMMC), or solid-state drives (SSDs), embedded systems, or computing network devices such as network routers or network processors, cache controllers and translation lookaside buffers, lookup tables, database engines, data compression hardware, artificial neural networks, intrusion prevention systems, custom computer, among others.

Figure 1A:
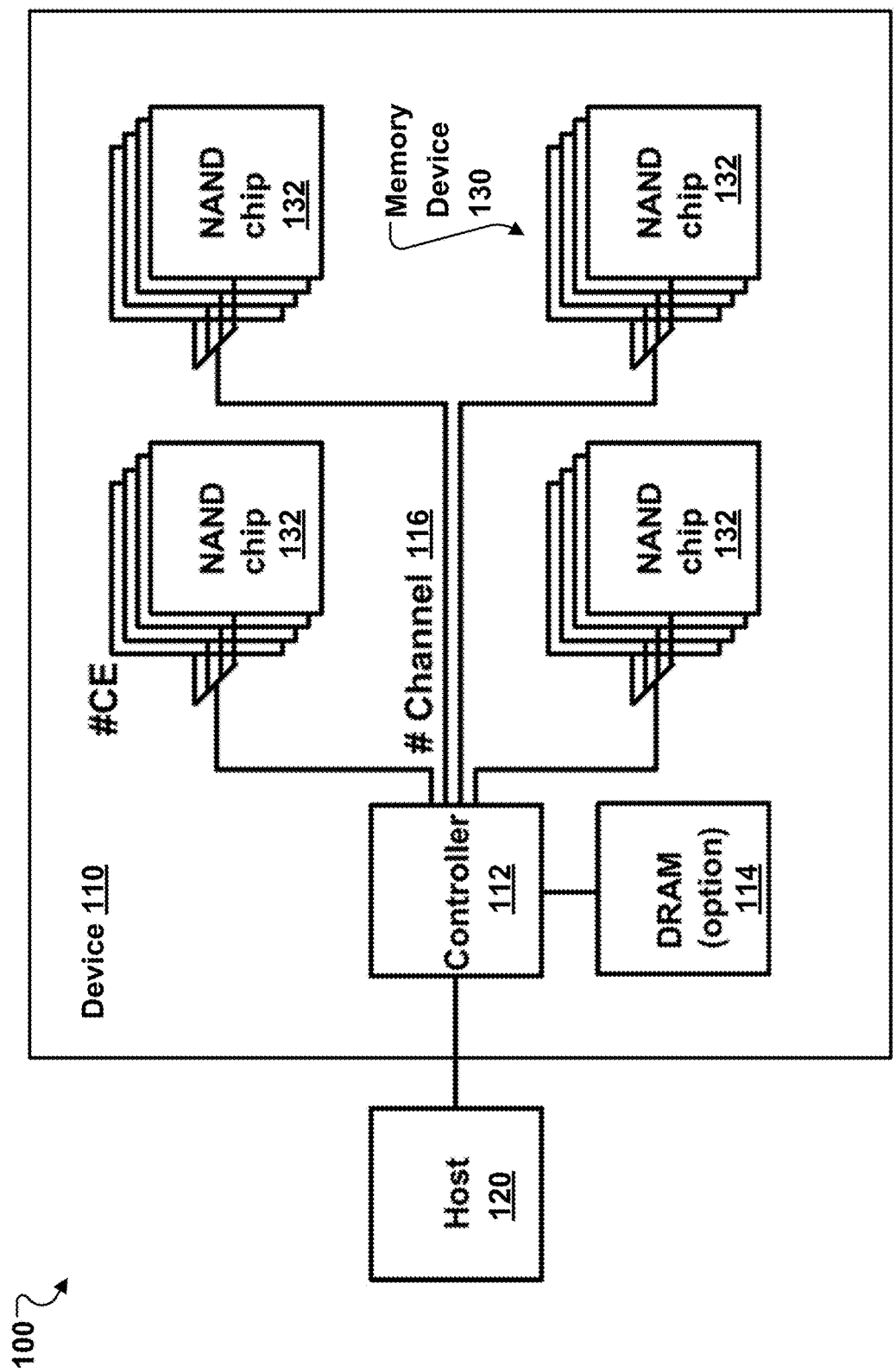
FIG. 1A illustrates an example of a system including multiple memory chips.

FIG. 1A illustrates an example of a system including a memory device having multiple memory chips. The system 100 includes a device 110 and a host device 120. The device 110 includes a device controller 112 and one or more memory devices 130. The device 110 can also include a Dynamic Random Access Memory (DRAM) 114 coupled to the device controller 112. The DRAM 114 can be configured to store or cache data from the device controller 112, the host 120, or the one or more memory devices 130.

Each memory device 130 can include one or more memory chips (e.g., NAND chips) 132. A memory chip can include one or more semiconductor dies. Each memory device 130 can be conductively coupled to the device controller 112 through a respective channel 116. Each memory chip 132 in a memory device 130 can be conductively coupled to the device controller 112 and selected by a chip-select (CE) signal through a corresponding channel 116 for the memory device 130.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 can be a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The device controller 112 can include a processor and an internal memory. The processor is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor is a general-purpose microprocessor, or an application-specific microcontroller. The processor can be also referred to as a central processing unit (CPU).

The processor accesses instructions and data from the internal memory. In some implementations, the internal memory is a Static Random Access Memory (SRAM) or a Dynamic Random Access Memory (DRAM). For example, in some implementations, when the device 110 is an eMMC, an SD card or a smart watch, the internal memory is an SRAM. In some implementations, when the device 110 is a digital camera or a media player, the internal memory is DRAM. In some implementations, the internal memory is a cache memory that is included in the device controller 112, as shown in FIG. 1A. The internal memory stores instruction codes, which correspond to the instructions executed by the processor, and/or the data that are requested by the processor during runtime.

The device controller 112 transfers the instruction code and/or the data from a memory device 130 to the internal memory. The memory device 130 can be a semiconductor device. In some implementations, the memory device is a non-volatile memory that is configured for long-term storage of instructions and/or data, e.g., a NAND flash memory device, or some other suitable non-volatile memory device. In implementations where the memory device 130 is NAND flash memory, the device 110 is a flash memory device, e.g., a flash memory card, and the device controller 112 is a NAND flash controller. For example, in some implementations, when the device 110 is an eMMC or an SD card, the memory device 130 is a NAND flash; in some implementations, when the device 110 is a digital camera, the memory device 130 is an SD card; and in some implementations, when the device 110 is a media player, the memory device 130 is a hard disk.

Figure 1B:
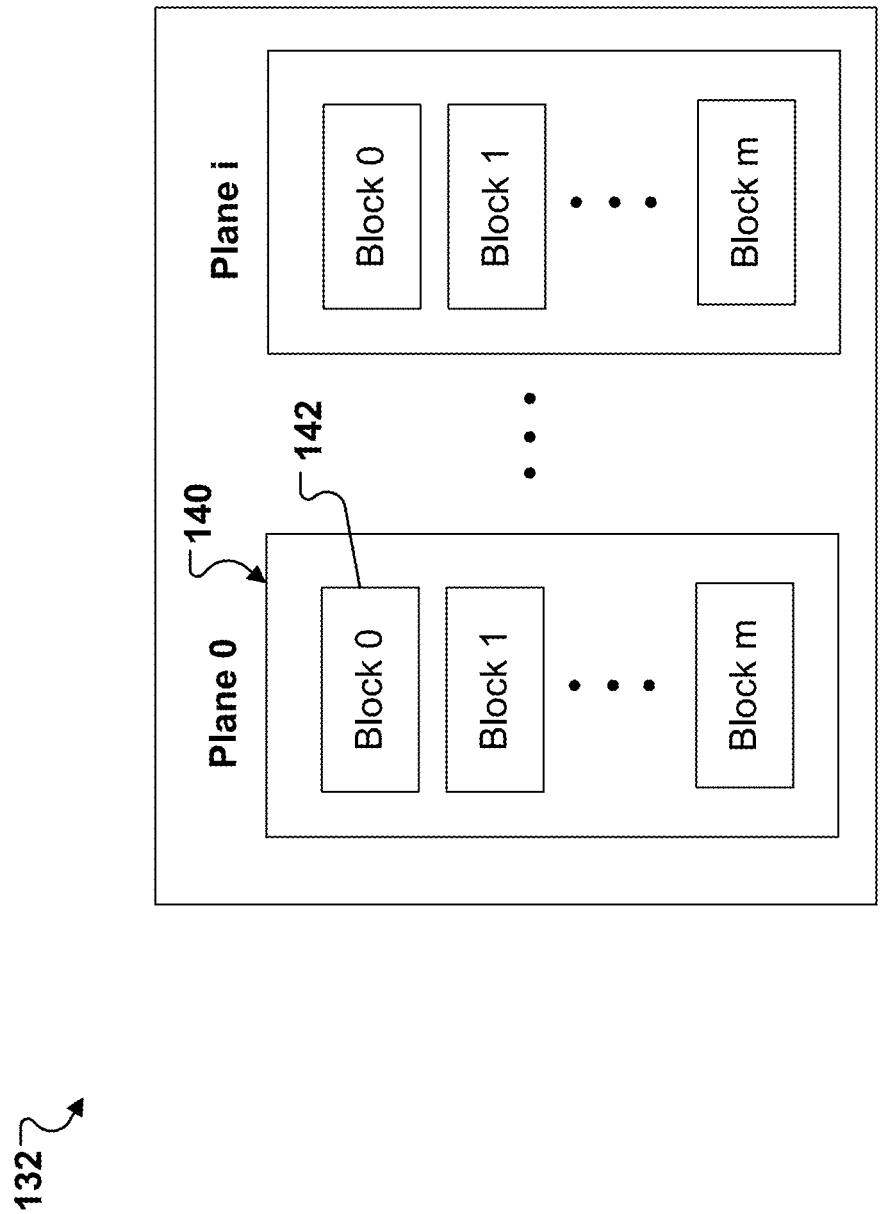
FIG. 1B illustrates an example memory chip including multiple planes.

FIG. 1B illustrates an example memory chip 132 including multiple planes 140, e.g., Plane 0, . . . , Plane i, where i is an integer, such as 0, 1, 2, . . . . The memory chip 132 can be implemented as the memory chip 132 of FIG. 1A. Each plane can include a plurality of blocks 142, e.g., Block 0, Block 1, . . . , Block m, where m is an integer such as 0, 1, 2, . . . . The memory chip 132 can be a two-dimensional (2D) memory chip including 2D memory blocks. The memory 132 can also be a three-dimensional (3D) memory chip (e.g., 3D NAND flash memory chip) including 3D memory blocks.

Figure 1C:
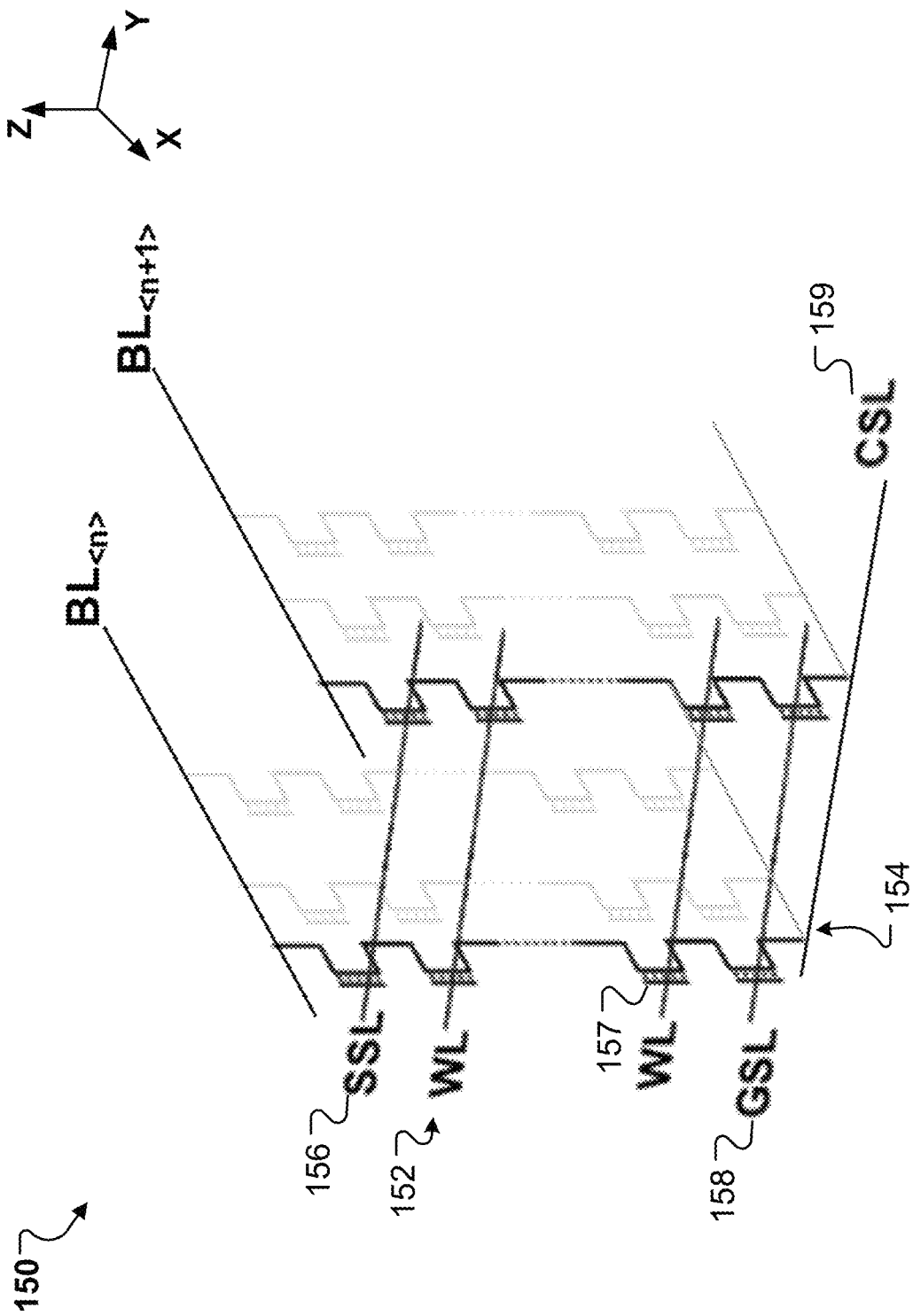
FIG. 1C illustrates an example three-dimensional (3D) block of a 3D memory chip.

FIG. 1C illustrates an example three-dimensional (3D) block 150 of a 3D memory chip (e.g., the 3D memory chip 132 of FIG. 1A or 1B). Memory cells 157 are arranged in three dimensions, e.g., in an XYZ coordinate system, and coupled to a number of word lines to form a number of pages (conductive layers or word line layers) 152 and a number of bit lines to form a number of strings 154. A page 152 can be a layer, e.g., in the XY plane, and memory cells 157 on the same layer can be coupled to one word line and have a same voltage. Each page 152 can be connected to a respective contact pad in a driving circuit, e.g., X-decoder (or a scanning driver).

A string 154 includes a number of memory cells 157 connected in series vertically along the Z direction, where a memory cell can be configured as a strong select transistor (SST) coupled to a string select line (SSL) 156 and a memory cell can be configured as a ground select transistor (GST) coupled to a ground select line (GSL) 158. The strings 154 are connected to one or more drivers, e.g., data drivers. The strings 154 of the memory cells 157 are connected to a common source line (CSL) 159 via the ground select transistors (GSTs). The SSL 156 can be a conductive line or layer formed on top of cell pages (or word line layers) 152. The block 150 can include multiple SSLs 156 on top of the pages 152. The CSL 159 can be a conductive layer (or multiple conductive lines) formed on a substrate of the 3D memory chip. The CSL 159 can be coupled to the ground.

Figure 2:
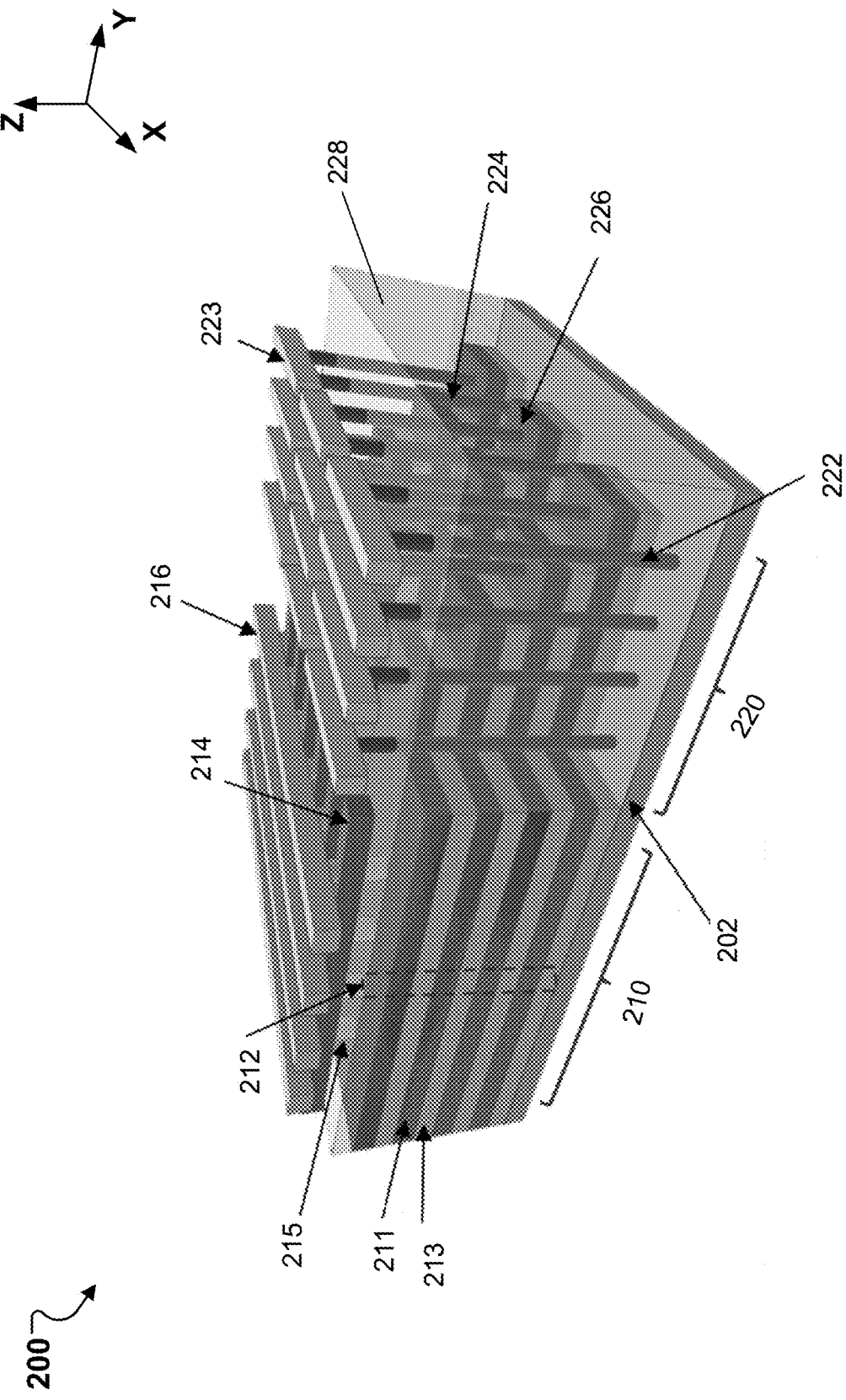
FIG. 2 illustrates a perspective view of an example 3D memory chip.

FIG. 2 illustrates a perspective view of an example 3D memory chip 200. The 3D memory chip 200 can be implemented as at least part of the memory chip 132 of FIG. 1A or 1B. The 3D memory chip 200 includes a memory array structure 210 and a staircase structure 220 configured to conductively connect the memory array structure 210 to a driving circuit, e.g., in a circuit under array (CuA) layer 202. The CuA layer 202 can be formed on a semiconductor substrate. The semiconductor substrate can include one or any combination of silicon, doped silicon, germanium, silicon germanium, semiconductor compounds, or any other suitable semiconductor materials.

The memory array structure 210 includes a number of vertical channels (VCs) (or channel pillars) 212. Each VC 212 includes a string of memory cells, e.g., the string 154 of FIG. 1C, and is coupled to a corresponding bit line (BL) 216 through a corresponding conductive VIA 215. In some implementations, the CuA layer 202 includes a plurality of active devices, such as transistors and a number of conducive lines that are electrically coupled to the conductive layers 211 (gate layer or word line layer) and insulated by an insulating material.

The VCs 212 penetrates downwards through multiple alternating pairs of conductive layers 211 (gate layer or word line layer) and insulating layers 213. The insulating layers 213 can be made of a dielectric material, e.g., silicon oxide (simplified as oxide or OX). The conductive layers 211 can be made of a conductive material, e.g., a metal such as Tungsten (W). The conductive layers 211 can form one more SSLs 214, e.g., SSL 156 of FIG. 1C, one or more word lines (WLs) 211, e.g., WL 157 of FIG. 1C, and one or more GSLs, e.g., GSL 158 of FIG. 1C. An external surface of the VC 212 contacts the conductive layers 211, which act as gates of the memory cells. The VC 212$s$ can include multiple layers that can include a tunneling layer, a charge trapping layer, and a blocking layer. The tunneling layer can include a silicon oxide, or a silicon oxide/silicon nitride combination (e.g., Oxide/Nitride/Oxide or ONO). The charge trapping layer can include silicon nitride (SiN) or other materials capable of trapping charges. The blocking layer can include silicon oxide, aluminum oxide, and/or combinations of such materials. The multiple layers can be formed on an internal surface of the VC 212, and polysilicon can be filled in a middle of the VC 212. The filled materials (e.g., the multiple layers and polysilicon) in each VC 212 intersecting the conductive layers 211 can form a string of memory cells (e.g., the memory cell 157 of FIG. 1C) along the vertical direction such as Z direction. A bit line pad (BLP) can be formed on a top of the VC 212 to seal the VC 212 such that the interior of the VC 212 is separated from an external environment during processing. The BLP is conductive and can be coupled to a bit line 216 through the conductive VIA 215.

The staircase structure 220 is configured to conductively connect word line layers 211 to the CuA layer 202. As illustrated in FIG. 2, a staircase structure is formed as an extension of the memory array structure 210, such that each word line layer 211 can be individually connected to a corresponding word line layer contact 224 at a landing area 226. The corresponding word line layer contact 224 is conductively connected to a respective contact pad in the CuA layer 202 through a corresponding through array contact (TAC) 222 that penetrates through an insulating material 228 filled in the staircase structure 220. The corresponding word line layer contact 224 is conductively connected to the corresponding TAC 222 through a conductive interconnection 223.

FIG. 3 illustrates an example of an integrated memory chip 300. The integrated memory chip 300 can be implemented as the memory chip 132 of FIG. 1A or 1B. As illustrated in FIG. 3, the integrated memory chip 300 can include three parts: an input/output (I/O) structure 310, a device-side structure 320, and one or more array-side structures 330. Circuits in the device-side structure 320 and each array-side structure 330 can be conductively coupled together to perform one or more operations (e.g., a write operation, a read operation, a programming operation, an erasing operation, and/or a search operation) on a memory array in the array-side structure 330. The I/O structure 310 can be configured to provide an interface for the device-side structure 320 or the integrated memory chip 300 to communicate with one or more external devices (e.g., a controller such as the controller 112 of FIG. 1A or a host controller in the host device 120 of FIG. 1A, or a power supply source).

Figure 5:
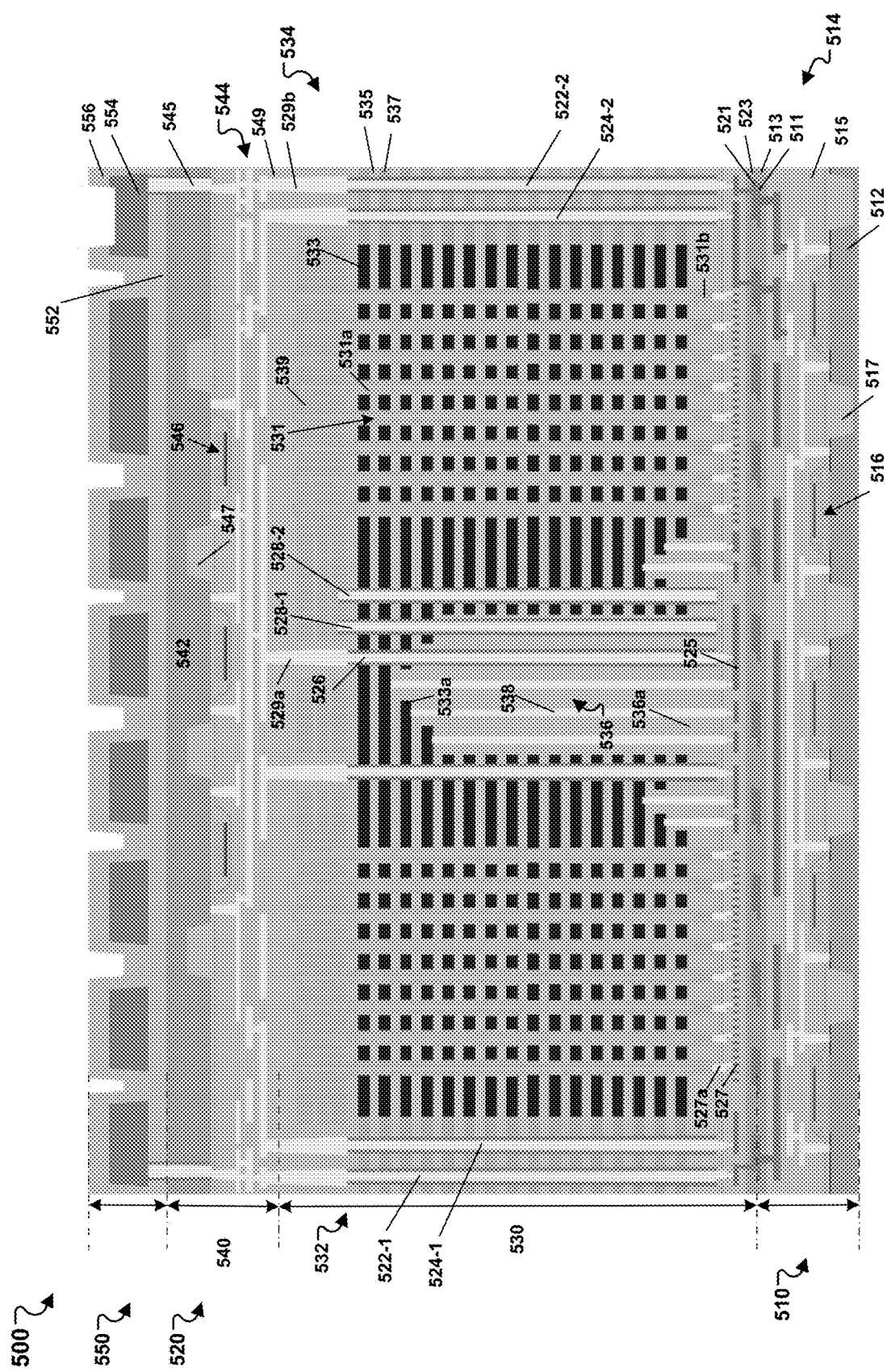
FIG. 5 illustrates a cross-section diagram of an example integrated 3D memory chip including separated circuits for a memory array.

The array-side structure 330 can be similar to, or same as, the memory chip 200 of FIG. 2, and can be formed on a semiconductor substrate (e.g., silicon wafer) using a CuA process. In some embodiments, the one or more array-side structures 330 can be formed in a single semiconductor substrate. The device-side structure 320 can be a semiconductor chip (e.g., a CMOS wafer) formed on another semiconductor substrate (e.g., silicon wafer). The device-side structure 320 can be integrated with the one or more array-side structures 330 (e.g., by a CbA process as illustrated in FIG. 5 or FIG. 6C). The I/O structure 310 can be integrated with the device-side structure 320 or the one or more array-side structures 330 (e.g., as illustrated with further details in FIG. 5 or FIG. 6D).

Figure 6A:
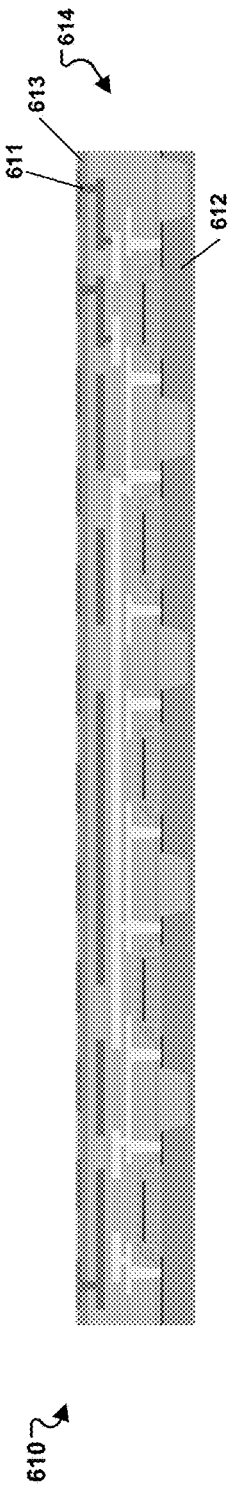
FIGS. 6A-6D illustrate a process of forming an example integrated 3D memory chip using two separate semiconductor chips.
Figure 6B:
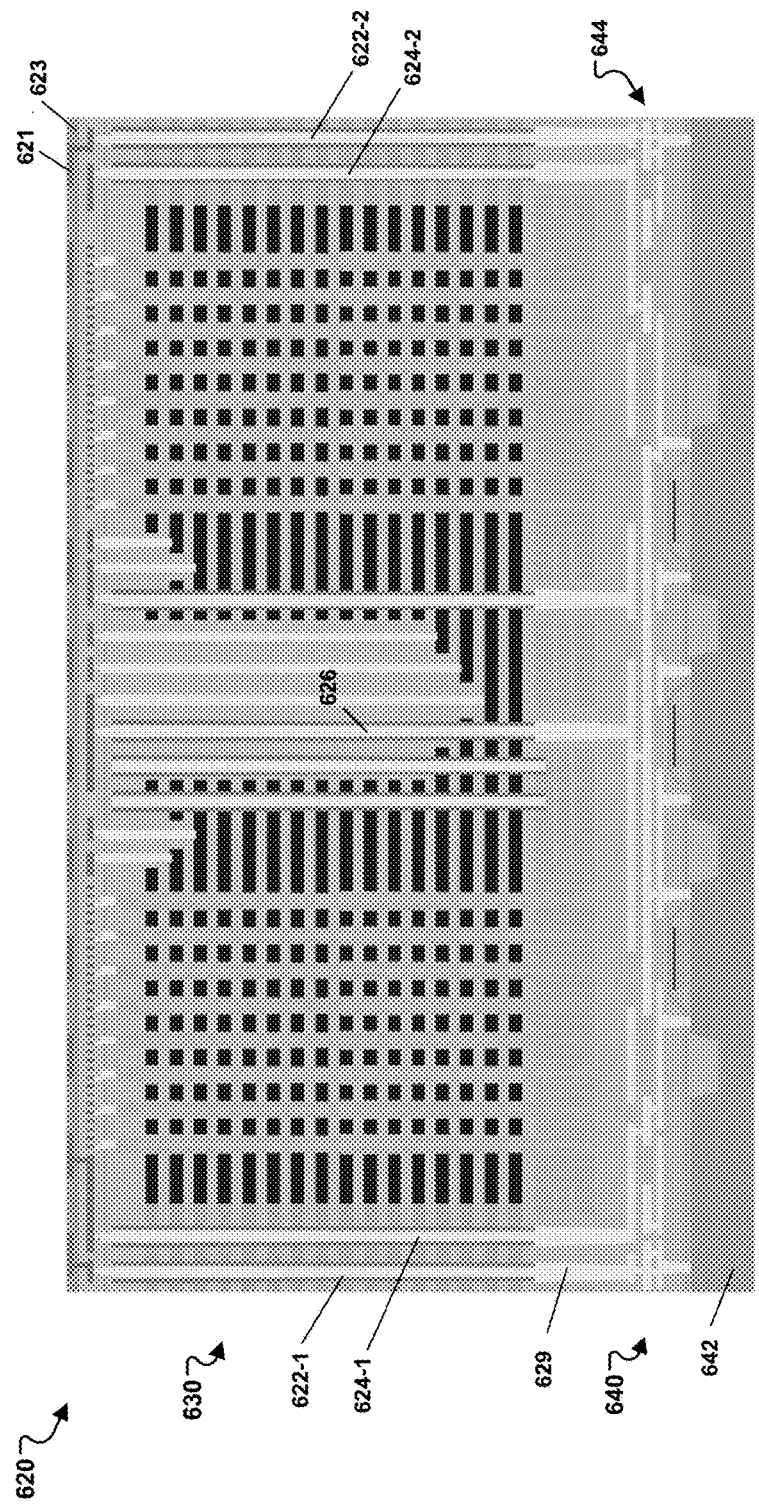
Figure 6C:
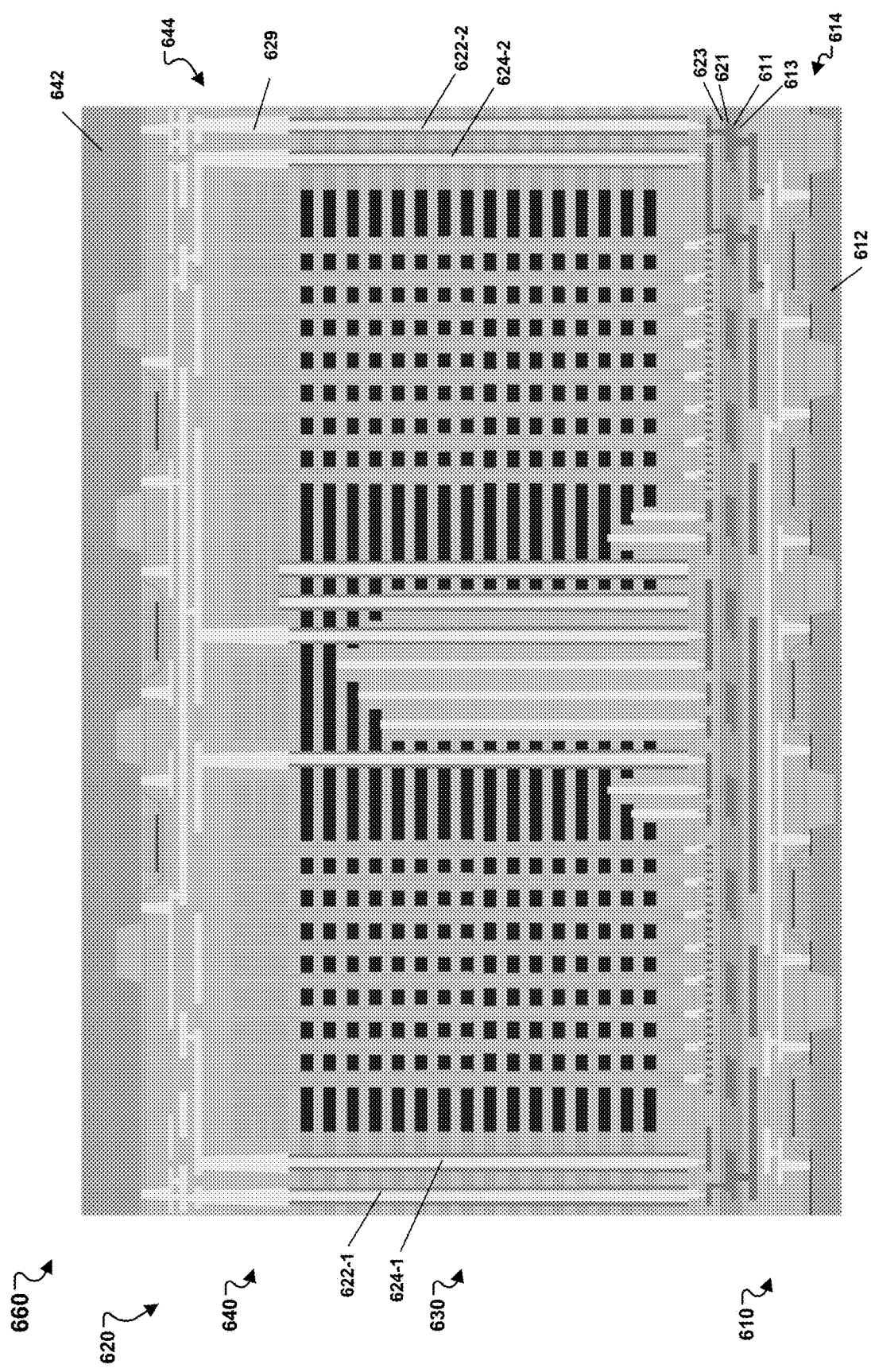
Figure 6D:
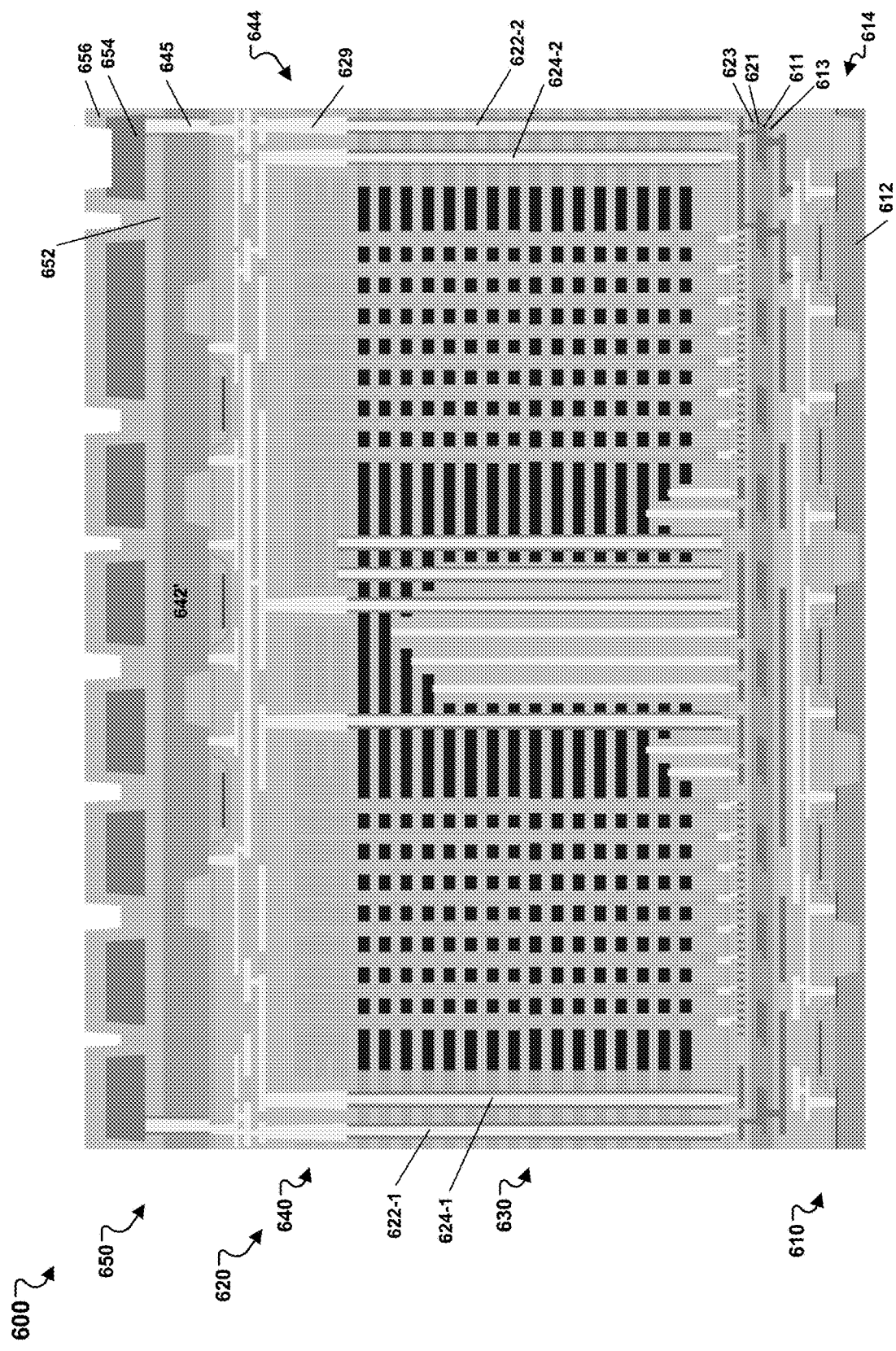

The I/O structure 310 can include one or more conductive pads, e.g., as described with further details in FIG. 5 or FIG. 6D. The device-side structure 320 can include a device-side integrated circuit 322 formed on a semiconductor substrate (e.g., silicon wafer). The device-side integrated circuit 322 can be conductively coupled to the one or more external devices through the one or more conductive pads in the I/O structure 310. The device-side integrated circuit 322 can include one or more logics or circuits configured for at least one of one or more global operations for the integrated memory chip 300, communication with the one or more external devices, and/or high speed operations. The one or more logics or circuits can have a high thermal sensitivity (or low thermal budget). In some embodiments, the device-side integrated circuit 322 includes a main control logic 324, a data path 326, a cache 328 (like a data buffer), and/or one or more peripheral circuits such as a clock generator.

The integrated memory chip 300 can include multiple planes, e.g., Plane 0, Plane 1, . . . , or Plane N, where N is an integer. Each plane can be associated with a corresponding array-side structure 330. An array-side structure 330 can be also referred to as an integrated plane module 330 that includes a memory array (or a plane) 332 and an array-side (or array-level) integrated circuit 340 conductively coupled to the memory array 332. Each array structure 330 can be independent from each other, and its array-side integrated circuit 340 can be individually and/or independently coupled to the device-side integrated circuit 322 in the device-side structure 320 to perform one or more operations on its memory array 332.

The memory array 332 can be a plane of memory cells (e.g., the plane 140 of FIG. 1B). The plane can include a number of blocks (e.g., the block 142 of FIG. 1B or the block 150 of FIG. 1C). In some embodiments, the memory array 332 can include an 3D array structure 334 and a staircase structure (or a stepped structure) 336. The 3D array structure 334 can include one or more subarray structures and the staircase structure 336 can be arranged therebetween. The 3D array structure 334 can be similar to, or same as, the memory array structure 210 of FIG. 2. The 3D array structure 334 can include a plurality of conductive layers (e.g., the conductive layer 211 of FIG. 2) separated from each other by insulating layers (e.g., the insulating layers 213 of FIG. 2) and a plurality of vertical channels (e.g., the VCs 212 of FIG. 2) being arranged orthogonally through the plurality of conductive layers and the insulating layers. Each of the plurality of vertical channels includes a string of memory cells (e.g., the string 154 of FIG. 1C). The staircase structure 336 can be similar to, or same as, the staircase structure 220 of FIG. 2. The 3D array structure 334 can be conductively coupled to the array-side integrated circuit 340 through the staircase structure 336, e.g., using conductive channels like the TACs 222 and the word line layer contacts 224.

The array-side integrated circuit 340 can be formed under the memory array 332 (e.g., according to a CuA process) and can have a same area as the memory array 332. The array-side integrated circuit 340 can be a CMOS circuit. The array-side integrated circuit 340 can be similar to, or same as, the CuA layer 202 of FIG. 2. The array-side integrated circuit 340 can include one or more logics or circuits configured for one or more local operations on the memory array 332. In some embodiments, the array-side integrated circuit 340 includes at least one of a core control logic 342, a word line decoder 344, a sense amplifier or a page buffer circuit 346, or a high voltage charge pump 348.

In some embodiments, e.g., as illustrated in FIG. 3, the core control logic 342 is conductively coupled to and communicate with the main control logic 324, e.g., receive a command (e.g., a read or write command) from the main control logic 324, and output data to the main control logic 324. The core control logic 342 can be conductively coupled to each of the word line decoder 344, the sense amplifier or the page buffer circuit 346, and the high voltage charge pump 348. The word line decoder 344 is conductively coupled to the conductive layers in the 3D array structure 334 through the staircase structure 336. The sense amplifier or the page buffer circuit 346 can be conductively coupled to the 3D array structure 334, e.g., for reading out data from the 3D array structure 334 or writing data into the 3D array structure 334. Thus, circuits for a memory array 332 can be separately formed in an array-side integrated circuit 340 of the array-side structure 330 and in the device-side integrated circuit 322 of the device-side structure 320 and can be conductively coupled together to perform one or more operations on the memory array 332.

In some embodiments, a logic or circuit (e.g., an SRAM buffer) can be formed in the array-side integrated circuit 340 or in the device-side integrated circuit 322. In some embodiments, a logic or circuit (e.g., a state machine) can have a first portion formed in the array-side integrated circuit 340 and a second portion formed in the device-side integrated circuit 322.

Compared to a CMOS chip including all circuits for a memory array, the device-side structure 320 in the integrated memory chip 300 can be formed as a separate semiconductor chip (e.g., a CMOS chip) with a smaller number of circuits. Thus, the device-side structure 320 can accommodate one or more additional logics or circuits. In some embodiments, a Computing-in-Memory (CIM) logic or circuit can be formed in the device-side integrated circuit 322 or in the device-side structure 320, e.g., for high efficiency computing. In some embodiments, one or more other functional logics or circuits, e.g., content-addressable-memory (CAM) logic or circuit, can be formed in the device-side integrated circuit 322 or in the device-side structure 320.

Figure 4C:
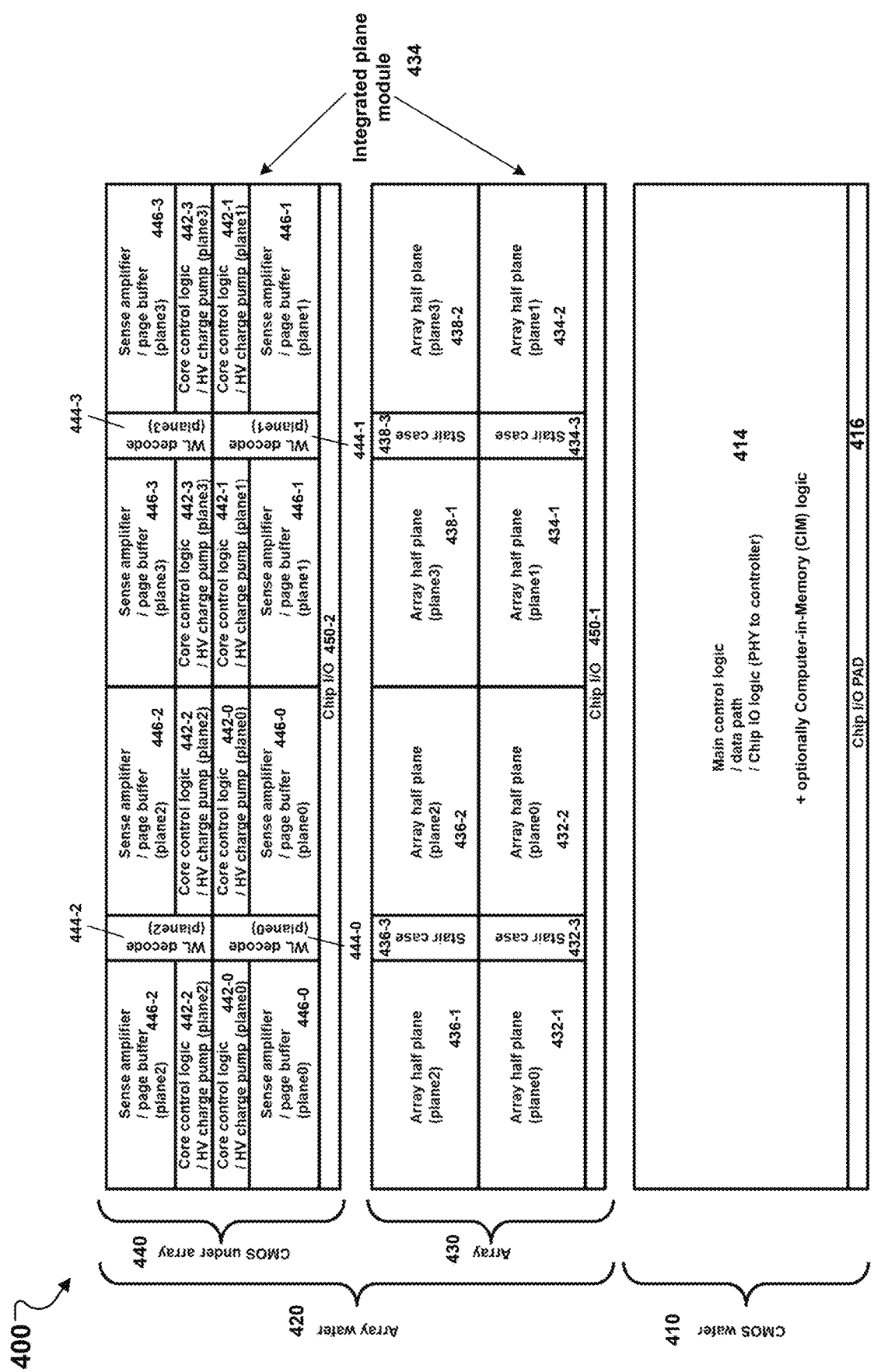

FIGS. 4A-4C illustrate an example integrated 3D memory chip 400 having multiple planes. The integrated 3D memory chip 400 can be implemented as the memory chip 132 of FIG. 1A or 1B. The integrated 3D memory chip 400 can be similar to, or same as, the integrated memory chip 300 of FIG. 3.

The integrated 3D memory chip 400 can be formed by integrating two separate semiconductor chips (e.g., a CMOS wafer 410 and an array wafer 420) by a wafer to wafer bonding process such as a CbA process. The array wafer 420 can include a plane array 430 and an array integrated circuit (e.g., CMOS under array) 440 integrated with the plane array 430 (e.g., by a CuA process). The CMOS wafer 410 can be similar to, or same as, the device-side structure 320 of FIG. 3, and can include a device-side integrated circuit 414 and chip I/O conductive pads 416 that are formed on a semiconductor substrate 412. The device-side integrated circuit 414 can be similar to, or same as, the device-side integrated circuit 322 of FIG. 3, and can include a main control logic, a data path, a chip I/O logic, and optionally a CIM logic. The chip I/O conductive pads 416 can be formed on a peripheral area of the device-side integrated circuit 414 (e.g., an edge of the CMOS wafer 410).

In some embodiments, e.g., as illustrated in FIGS. 4A-4C, the plane array 430 includes four planes, e.g., Plane 0, Plane 1, Plane 2, Plane 3. Each plane can be similar to, or same as, the plane 140 of FIG. 1B. The integrated 3D memory chip 400 can include four integrated plane modules 432, 434, 436, 438 respectively associated with the four planes. Each integrated plane module 432, 434, 436, 438 can be similar to, or same as, the array-side structure 330 of FIG. 3. The four integrated plane modules 432, 434, 436, 438 can be integrated on a same CMOS wafer 410. Each integrated plane module can be separated from each other, e.g., by an air gap 431 or an insulating material 431 along two perpendicular directions.

Each integrated plane module 432, 434, 436, 438 includes a memory array plane (Plane 0, Plane 1, Plane 2, Plane 3) and an array-side integrated circuit. The memory array plane can be similar to, or same as, the memory array 332 of FIG. 3. For example, each memory array plane can include a first subarray structure (e.g., half plane), a second subarray structure (e.g., half plane), and a staircase (SC) structure (or a stepped structure) between the first and second subarray structures. The array-side integrated circuit can be similar to, or same as, the array-side integrated circuit 340 of FIG. 3. For example, the array-side integrated circuit can include a core control logic, a sense amplifier or a page buffer circuit, a high voltage charge pump, and/or a word line decoder or a word line switch. A page buffer circuit can include one or more page buffers. The array-side integrated circuit can be formed on the memory array plane and be conductively coupled to the memory array plane and to the device-side integrated circuit 414. The array-side integrated circuits of the memory array planes (e.g., the plane array 430) can form the array integrated circuit 440.

As illustrated in FIGS. 4A-4C, the integrated 3D memory chip 400 can be separated into three parts that can be stacked together with a same area. For example, a top part can include the array integrated circuit 440 (e.g., CMOS under array 440) that includes the array-side integrated circuits for the four planes. A middle part can include the four planes (e.g., 3D memory array structures and associated staircases). A bottom part can include the device-side integrated circuit 414 (e.g., a main control logic and I/O circuit). Thus, both of the top part and the bottom part provide circuits (e.g., peripheral circuits) for the middle part (memory arrays). In the integrated 3D memory chip 400, a total array area can be a half of a total circuit area. Accordingly, a chip size can become smaller, e.g., to a half, compared to a normal architecture having just one integrated circuit for the memory array formed by either CuA process or CbA process.

In some embodiments, as illustrated in FIGS. 4A-4C, the integrated plane module 432 includes two subarray structures 432-1, 432-2 (e.g., half planes of Plane 0) and a staircase (SC) 432-3 between the two subarray structures 432-1, 432-2. The array-side integrated circuit in the integrated plane module 432 can include a core control logic and/or high voltage charge pump 442-0 formed on the two subarray structures 432-1, 432-2, a word line decoder 444-0 formed on top of the staircase 432-3, and/or a sense amplifier/page buffer circuit 446-0 that is adjacent to the core control logic/high voltage charge pump 442-0 and formed on the two subarray structures 432-1, 432-2. Note that, for illustration purpose only, the core control logic/high voltage charge pump 442-0 is shown on top of the two subarray structures 432-1, 432-2, but the core control logic/high voltage charge pump 442-0 can be an integrated circuit and not separately formed on the two subarray structures 432-1, 432-2. Similarly, the sense amplifier/page buffer circuit 446-0 can be also an integrated circuit formed on the two subarray structures 432-1, 432-2.

Similarly, the integrated plane module 434 includes two subarray structures 434-1, 434-2 (e.g., half planes of Plane 1) and a staircase (SC) 434-3 between the two subarray structures 434-1, 434-2. The array-side integrated circuit in the integrated plane module 434 can include a core control logic and/or high voltage charge pump 442-1 formed on the two subarray structures 434-1, 434-2, a word line decoder 444-1 formed on top of the staircase 434-3, and/or a sense amplifier/page buffer circuit 446-1 adjacent to the core control logic/high voltage charge pump 442-1 and formed on the two subarray structures 434-1, 434-2.

The integrated plane module 436 includes two subarray structures 436-1, 436-2 (e.g., half planes of Plane 2) and a staircase (SC) 436-3 between the two subarray structures 436-1, 436-2. The array-side integrated circuit in the integrated plane module 436 can include a core control logic and/or high voltage charge pump 442-2 formed on the two subarray structures 436-1, 436-2, a word line decoder 444-2 formed on top of the staircase 436-3, and/or a sense amplifier/page buffer circuit 446-2 adjacent to the core control logic/high voltage charge pump 442-2 and formed on the two subarray structures 436-1, 436-2.

The integrated plane module 438 includes two subarray structures 438-1, 438-2 (e.g., half planes of Plane 3) and a staircase (SC) 438-3 between the two subarray structures 438-1, 438-2. The array-side integrated circuit in the integrated plane module 438 can include a core control logic and/or high voltage charge pump 442-3 formed on the two subarray structures 438-1, 438-2, a word line decoder 444-3 formed on top of the staircase 438-3, and/or a sense amplifier/page buffer circuit 446-3 adjacent to the core control logic/high voltage charge pump 442-3 and formed on the two subarray structures 438-1, 438-2.

In some embodiments, as illustrated in FIG. 4C, the core control logics/high voltage charge pumps 442-0 and 442-2 are arranged adjacent to each other and isolated from each other along a first direction, the core control logics/high voltage charge pumps 442-1 and 442-3 are arranged adjacent to each other and isolated from each other along the first direction. The core control logics/high voltage charge pumps 442-0 and 442-1 are arranged adjacent to each other and isolated from each other along a second direction perpendicular to the first direction. The core control logics/high voltage charge pumps 442-2 and 442-3 are arranged adjacent to each other and isolated from each other along the second direction. The sense amplifiers/page buffer circuits 446-0 and 446-1 are arranged adjacent to each other and isolated from each other along the second direction. The sense amplifiers/page buffer circuits 446-2 and 446-3 are arranged adjacent to each other and isolated from each other along the second direction.

In some embodiments, as illustrated in FIGS. 4A-4C, the array wafer 420 includes a first chip I/O structure 450-1 for the plane array 430 and a second chip I/O structure 450-2 for the array integrated circuit 440. The first chip I/O structure 450-1 and the second chip I/O structure 450-2 can be arranged on a peripheral area (e.g., an edge) of the plane array 430 and the array integrated circuit 440, respectively. Each of the first and second chip I/O structures 450-1, 450-2 can include one or more parts each individually coupled to a corresponding integrated plane module. The first and second chip I/O structures 450-1, 450-2 can be configured to conductively connect each plane in the plane array 430 to a corresponding array-side integrated circuit in the array integrated circuit 440 and/or to the device-side integrated circuit 414 in the CMOS wafer 410. The CMOS wafer 410 can also include a chip I/O structure 416 that can include one or more I/O conductive pads, which can be formed on a peripheral area (e.g., an edge) of the CMOS wafer 410. The device-side integrated circuit 414 can be conductively coupled to the array-side integrated circuits in the array wafer 420 and/or to an external device, e.g., a controller such as the controller 112 of FIG. 1A or a host controller in the host device 120 of FIG. 1A, or a power supply source.

FIG. 5 illustrates a cross-section diagram of an example integrated 3D memory chip 500 including separate peripheral circuits for a memory array. The integrated 3D memory chip 500 can be implemented as the memory chip 132 of FIG. 1A or 1B. For illustration purpose only, one memory array is shown in FIG. 5. However, as described in FIG. 3, FIGS. 4A-4C, an integrated 3D memory chip can include two or more memory arrays with peripheral circuits formed in a similar or same way as the integrated 3D memory chip 500.

As illustrated in FIG. 5, the integrated 3D memory chip 500 includes a device-side structure 510, an array-side structure 520, and an input/output (I/O) structure 550. In some embodiments, as shown in FIG. 5, the I/O structure 550 is formed on a first side of the array-side structure 520, and a second side of the array-side structure 520 is opposite to the first side of the array-side structure 520 and can be integrated with the device-side structure 510, for example, by a bonding process such as a CbA process. In some embodiments, the I/O structure 550 can be formed on a first side of the device-side structure 510, and a second side of the device-side structure 510 is opposite to the first side of the device-side structure 510 and can be integrated with the array-side structure 520, e.g., by a CbA process.

The device-side structure 510 can be similar to, or same as, the device-side structure 320 of FIG. 3 or the CMOS wafer 410 of FIGS. 4A-4C. The device-side structure 510 can be a semiconductor chip (e.g., a CMOS chip) formed on a semiconductor substrate 512 (e.g., the semiconductor substrate 412 of FIGS. 4A-4B). The device-side structure 510 can include a device-side integrated circuit 514 (e.g., the device-side integrated circuit 322 of FIG. 3, 414 of FIGS. 4A-4C) formed in the semiconductor substrate 512. In some embodiments, the device-side integrated circuit 514 includes a main control logic, a data path, a cache (like a data buffer), and/or one or more peripheral circuits such as a clock generator. The device-side integrated circuit 514 can include a plurality of transistors 516 that can be conductively isolated from each other, e.g., by shallow trench isolations (STIs) 517 formed between adjacent transistors 516. At least one of the transistors 516 can be a metal-oxide-semiconductor (MOS) transistor.

In some embodiments, as illustrated in FIG. 5, the device-side structure 510 includes a top layer 513 having a series of connection pads 511 on top of the device-side integrated circuit 514. At least one of the connection pads 511 is conductively coupled to the device-side integrated circuit 514, e.g., to one or more transistors 516. In some examples, the connection pads 511 are made of metal, e.g., copper (Cu), and the connection pads 511 can be conductively isolated from an isolating material in the top layer 513, e.g., silicon carbon nitride (SiCN).

The array-side structure 520 can be similar to, or same as, the memory chip 200 of FIG. 2, the array-side structure 330 of FIG. 3, the integrated plane module 432, 434, 436, or 438 of FIGS. 4A-4C. As illustrated in FIG. 5, the array-side structure 520 can include a memory array 530 and an array circuit 540 that includes another semiconductor substrate 542 and an array-side integrated circuit 544 formed on the semiconductor substrate 542. The semiconductor substrate 542 includes first and second opposite sides. The array-side integrated circuit 544 can be formed in the first side of the semiconductor substrate 542, and the memory array 530 can be formed on the array-side integrated circuit 544, e.g., using a CuA process. The array-side integrated circuit 544 can be similar to, or same as, the array-side integrated circuit 340 of FIG. 3 or circuits in the CuA layer 202 of FIG. 2. In some embodiments, the array-side integrated circuit 544 includes at least one of a core control logic (e.g., the core control logic 342 of FIG. 3), a word line decoder (e.g., the word line decoder 344 of FIG. 3), a sense amplifier or a page buffer circuit (e.g., the sense amplifier or the page buffer circuit 346 of FIG. 3), or a high voltage charge pump (e.g., the high voltage charge pump 348 of FIG. 3). The array-side integrated circuit 544 can include one or more transistors 546 (e.g., MOS transistors) that are isolated by STIs 547 formed between adjacent transistors 546.

The I/O structure 550 can be formed on the second side of the semiconductor substrate 542. The I/O structure 550 can be similar to, or same as, the I/O structure 310 of FIG. 3. In some embodiments, the I/O structure 550 includes a first layer 552 made of an insulating material (e.g., oxide) on the second side of the semiconductor substrate 542, a series of conductive pads 554 (e.g., made of a metal/alloy material such as AlCu) formed on the first layer 552, and a passivation or protective layer 556. The passivation or protective layer 556 can be made of an isolating material (e.g., SiOx) that can be filled into spacers between adjacent conductive pads 554.

Similar to the device-side structure 510, the array-side structure 520 can include a top layer 523 including a plurality of connection pads 521. The top layer 523 of the array-side structure 520 is on top of the memory array 530 and is in contact with the top layer 513 of the device-side structure 510. Particularly, the connection pads 521 of the array-side structure 520 and the connection pads 511 of the device-side structure 510 are aligned with each other and integrated together, e.g., by a bonding process. In some embodiments, the connection pads 521 are made of metal, e.g., copper (Cu), and the connection pads 521 can be conductively isolated from an isolating material in the top layer 523, e.g., silicon carbon nitride (SiCN). As shown with further details in FIG. 6C, the device-side structure 510 and the array-side structure 520 can be integrated together by aligning and bonding the connection pads 511 and 521 together.

In some embodiments, the memory array 530 includes a 3D array structure 532 and a staircase (or stepped) structure 536. The memory array 530 can further include one or more common source layers 539 (e.g., the CSL 159 of FIG. 1C) formed between the 3D array structure 532/the staircase structure 536 and the array-side integrated circuit 544. The one or more common source layers 539 can be made of polysilicon.

The 3D array structure 532 can be similar to, or same as, the memory array structure 210 of FIG. 2. The staircase structure 536 can be similar to, or same as, the staircase structure 220 of FIG. 2 or the staircase structure 432-3 (or 434-3, 436-3, or 438-3) of FIG. 4A-4C. The 3D array structure 532 can include a plurality of conductive layers 533 (e.g., the conductive layers 211 of FIG. 2) separated from each other by insulating layers 535 (e.g., the insulating layers 213 of FIG. 2) and a plurality of vertical channels (VCs) 531 (e.g., the vertical channels 212 of FIG. 2) arranged orthogonally through the plurality of conductive layers 533 and the insulating layers 535. Each of the plurality of vertical channels 531 includes a string of memory cells 531a (e.g., the memory cell 157 of FIG. 1C). The insulating layers 535 can be made of a dielectric material, e.g., silicon nitride (SiN). The conductive layers 533 can be made of a conductive material, e.g., a metal such as Tungsten (W).

An external surface of the VC 531 contacts the conductive layers 533, which act as gates of the memory cells 531a. The VCs 531 can include multiple layers that can include a tunneling layer, a charge trapping layer, and a blocking layer. The tunneling layer can include a silicon oxide, or a silicon oxide/silicon nitride combination (e.g., Oxide/Nitride/Oxide or ONO). The charge trapping layer can include silicon nitride (SiN) or other materials capable of trapping charges. The blocking layer can include silicon oxide, aluminum oxide, and/or combinations of such materials. The multiple layers can be formed on an internal surface of the VC 531, and polysilicon can be filled in a middle of the VC 531. A bit line pad (BLP) 531b can be formed on a top of the VC 531 to seal the VC 531 such that the interior of the VC 531 is separated from an external environment during processing. The BLP 531b is conductive and can be coupled to a bit line 527 through a conductive VIA 527a.

In some embodiments, the 3D array structure 532 includes first and second subarray structures (e.g., the subarray structures 432-1, 432-2 of FIGS. 4A-4C) and the staircase structure 536 (e.g., the staircase structure 432-3 of FIG. 4A-4C) can be between the first and second subarray structures. The staircase structure 536 can be formed as an extension of the 3D array structure 532, such that each word line layer can be individually connected to a corresponding word line layer contact 538 at a landing area 533a. The corresponding word line layer contact 538 can be conductively connected to a respective contact pad in the array-side integrated circuit 544 through a corresponding through array contact (TAC) 526 and a corresponding conductive VIA 529a (through the one or more common source layers 539). At least one of the corresponding word line layer contact 538 and the corresponding TAC 526 can be a conductive channel that penetrates through an insulating material 536a (e.g., silicon oxide) filled in the staircase structure 536. The corresponding word line layer contact 538 can be conductively connected to the corresponding TAC 526 through a conductive interconnection 525. In such a way, the 3D array structure 532 can be conductively coupled to the array-side integrated circuit 544. In some embodiments, one or more staircase (SC) support channels 528-1, 528-2 can be formed through a region of the staircase structure 536 into the one or more common source layers 539.

In some embodiments, as illustrated in FIG. 5, the memory array 530 further includes one or more extension structures 534 adjacent to the 3D array structure 532 (e.g., from sides of the first and second subarray structures). An extension structure 534 can include a plurality of dielectric layers 537 extending from the plurality of conductive layers 533 and being separated by the insulating layers 535.

In some embodiments, one or more logics or circuits in the array-side integrated circuit 544 can be conductively coupled to one or more logics or circuits in the device-side integrated circuit 514 by one or more corresponding second through-array contacts (TACs) 524-1, 524-2 through a corresponding extension structure 534 and a corresponding conductive VIA 529b (e.g., through an insulating material 549 filled between conductive components in the array-side structure 520). In some embodiments, the device-side integrated circuit 514 can be conductively coupled to one or more external devices (e.g., a controller such as the controller 112 of FIG. 1A or a host controller in the host device 120 of FIG. 1A, or a power supply source) through the one or more conductive pads 554 in the I/O structure 550. One or more logics or circuits in the device-side integrated circuit 514 can be conductively coupled to a corresponding conductive pad 554 by a corresponding third TAC 522-1, 522-2, a corresponding conductive VIA 529b, and a corresponding conductive VIA 545 formed through the semiconductor substate 542. Each of the second TAC and the third TAC can include a conductive material, e.g., W, filled in a through-array hole and insulated from a surround material v In such a way, circuits in the device-side structure 510 and the array-side structure 520 can be conductively coupled together to perform one or more operations (e.g., a write operation, a read operation, a programming operation, an erasing operation, and/or a search operation) on the memory array 530 in the array-side structure 520. The I/O structure 550 can be configured to provide an interface for the device-side structure 510 to communicate with the one or more external devices.

FIGS. 6A-6D illustrate a process of forming an example integrated 3D memory chip 600 using two separate semiconductor chips 610, 620. The integrated 3D memory chip 600 can be the integrated 3D memory chip 500 of FIG. 5. For simplicity and illustration, labels for some components are illustrated in FIGS. 6A-6D, while the other components are not labelled and can refer back to corresponding components in FIG. 5.

FIG. 6A shows a first semiconductor chip 610 that can be a device-side structure 510 of FIG. 5. The first semiconductor chip 610 can be a CMOS chip. The first semiconductor chip 610 includes a device-side integrated circuit 614 (e.g., the device-side integrated circuit 514 of FIG. 5) formed on a semiconductor substrate 612 (e.g., the semiconductor substrate 512 of FIG. 5). The first semiconductor chip 610 includes a top layer 613 (e.g., the top layer 513 of FIG. 5) having a plurality of connection pads 611 (e.g., the connection pads 511 of FIG. 5). The connection pads 611 can be conductive, e.g., made of metal such as copper.

FIG. 6B shows a second semiconductor chip 620 that can be similar to an array-side structure 520 of FIG. 5. The second semiconductor chip 620 can include a memory array 630 (e.g., the memory array 530 of FIG. 5) and an array circuit 640 (e.g., the array circuit 540 of FIG. 5). The array circuit 640 includes another semiconductor substrate 642 and an array-side integrated circuit 644 (e.g., the array-side integrated circuit 544 of FIG. 5) formed on the semiconductor substrate 642. The array-side integrated circuit 644 can be conductively coupled to the memory array 630 by one or more TACs 626 (e.g., the TACs 526 of FIG. 5). The second semiconductor chip 620 has a top layer 623 (e.g., the top layer 523 of FIG. 5) having a plurality of connection pads 621 (e.g., the connection pads 521 of FIG. 5). The connection pads 621 can be conductive, e.g., made of metal such as copper. The second semiconductor chip 620 includes one or more second TACs 624-1, 624-2 (e.g., the second TACs 524-1, 524-2 of FIG. 5), one or more third TACs 622-1, 622-2 (e.g., the third TACs 522-1, 522-2 of FIG. 5), and one or more conductive VIAs 629 (e.g., the conductive VIAs 529a, 529b of FIG. 5).

FIG. 6C shows an integrated device 660 that is an integration of the first semiconductor chip 610 and the second semiconductor chip 620, e.g., by a wafer-to-wafer bonding process such as CbA process. The second semiconductor chip 620 can be flipped over and arranged on top of the first semiconductor chip 610, e.g., by aligning the connection pads 621 in the top layer 623 of the second semiconductor chip 620 with the connection pads 611 in the top layer 613 of the first semiconductor chip 610. After alignment, the integrated device 660 can be bonded with pressure and/or heat, and then cooled down. By the integration, the array-side integrated circuit 644 can be conductively coupled to the device-side integrated circuit 614 through the conductive VIAs 629, the second TACs 624-1, 624-2, and the bonded connection pads 621, 611.

Then, the semiconductor substrate 642 can be thinned to have a thinner thickness. The thinned semiconductor substrate 642' can be similar to, or same as, the semiconductor substate 542 of FIG. 5. Then, an input/output (I/O) structure 650 (e.g., the I/O structure 550 of FIG. 5) is formed on top of the integrated device 660 with the thinned semiconductor substrate 642' to form the integrated 3D memory chip 600. As illustrated in FIG. 6D, the I/O structure 650 can include a first layer 652 (e.g., the first layer 552 of FIG. 5) on top of the thinned semiconductor substrate 642', a series of conductive pads 654 (e.g., the conductive pads 554 of FIG. 5) formed on the first layer 652, and a passivation or protective layer 656 (e.g., the passivation or protective layer 556 of FIG. 5). The I/O structure 650 can be formed by a backend-of-the-line (BEOL) process. One or more conductive VIAs 645 (e.g., the conductive VIAs 545 of FIG. 5) can be formed through the thinned semiconductor substrate 642' and the first layer 652 using a through silicon via (TSV) process. The one or more conductive VIAs 645 are configured to conductively connect the conductive VIAs 629 to the conductive pads 654, such that the device-side integrated circuit 614 can be conductively coupled to one or more external devices through the third TACs 622-1, 622-2, the conductive VIAs 629, the conductive VIAs 645, and the conductive pads 654.

FIG. 7A illustrates an example integrated 3D memory chip 700 including a multi-stack array structure 720. The integrated 3D memory chip 700 can be implemented as the memory chip 132 of FIG. 1A or 1B.

The integrated 3D memory chip 700 includes a device-side structure 710 and the multi-stack array structure 720 that is integrated on the device-side structure 710. The device-side structure 710 can be similar to, or same as, the device-side structure 320 of FIG. 3, 410 of FIGS. 4A-4C, 510 of FIG. 5, or 610 of FIGS. 6A-6D. The device-side structure 710 can include a device-side integrated circuit 714 (e.g., the device-side integrated circuit 322 of FIG. 3, 414 of FIGS. 4A-4C, 514 of FIG. 5, or 614 of FIGS. 6A-6D) formed on a semiconductor substrate 712 (e.g., the semiconductor substrate 412 of FIGS. 4A-4C, 512 of FIG. 5 or 612 of FIGS. 6A-6D).

The multi-stack array structure 720 includes multiple array stacks 720-1, 720-2, 720-3, ..., 720-n, where n is an integer larger than 1, that are sequentially stacked one by one on the device-side structure 710, e.g., by a CbA process. The multiple array stacks can be stacked along a vertical direction (e.g., Z direction) perpendicular to a horizontal plane (e.g., XY plane). This architecture enables to further increase the device capacity of the integrated 3D memory chip 700 within a small area same as the device-side integrated circuit 714.

Each array stack can be similar to, same as, the array wafer 420 of FIGS. 4A-4C. Each array stack can include one or more integrated plane modules (e.g., the integrated plane module 432, 434, 436, or 438 of FIGS. 4A-4C). Each integrated plane module has a plane and a corresponding plane-side integrate circuit, e.g., as illustrated in FIGS. 4A-4C. Each plane-side integrated circuit can be conductively coupled to the device-side integrated circuit 714, such that one or more operations (e.g., a write operation, a read operation, a programming operation, an erasing operation, and/or a search operation) can be performed on the plane.

Different array stacks 720-1, 720-2, 720-3, ..., and/or 720-n can have a same structure (e.g., a same number of integrated plane modules) As illustrated in FIG. 7A, each array stack has a same number of integrated plane modules that have two planes, e.g., Plane 0 and Plane 1 for the array stack 720-1, Plane 2 and Plane 3 for the array stack 720-2, Plane 4 and Plane 5 for the array stack 720-3, ..., and Plane 2(N−1) and Plane 2N−1 for the array stack 720-n. In some embodiments, different array stacks can also have different structures (e.g., different numbers of integrated plane modules).

FIG. 7B illustrates examples of single array stacks having different numbers of planes. Diagram (a) shows an array wafer 730 having one plane (Plane 0) that can be formed on a device-side structure or another array stack by a CbA process. Diagram (b) shows an array wafer 732 having two planes (e.g., Plane 0, Plane 1) that can be formed on a device-side structure or another array stack by a CbA process. Diagram (c) shows an array wafer 734 having four planes (e.g., Plane 0, Plane 1, Plane 2, Plane 3), e.g., similar to the array wafer 420 of FIGS. 4A-4C, that can be formed on a device-side structure or another array stack by a CbA process.

FIG. 8 illustrates a cross-section diagram of an example integrated 3D memory chip 800 including two array stacks. The integrated 3D memory chip 800 can be similar to, or same as, the integrated 3D memory chip 700 of FIG. 7. The integrated 3D memory chip 800 can be implemented as the memory chip 132 of FIG. 1A or 1B.

Similar to the integrated 3D memory chip 500 of FIG. 5, the integrated 3D memory chip 800 includes a device-side structure 810 (e.g., the device-side structure 510 of FIG. 5) and an input/output (I/O) structure 850 (e.g., the I/O structure 550 of FIG. 5). However, different from the integrated 3D memory chip 500 of FIG. 5 having only one array-side structure 520 integrated on the device-side structure 510, the integrated 3D memory chip 800 includes two array stacks 820a, 820b sequentially integrated on the device-side structure 810. For simplicity and illustration, labels for some components are illustrated in FIG. 8, while the other components are not labelled and can refer back to corresponding components in FIG. 5.

The device-side structure 810 can be similar to, or same as, the device-side structure 510 of FIG. 5, 610 of FIGS. 6A-6D, or 710 of FIG. 7A. The device-side structure 810 includes a device-side integrated circuit 814 formed on a semiconductor substrate 712. The device-side structure 810 also includes a top layer 813 (e.g., the top layer 513 of FIG. 5) having a plurality of connection pads 811 (e.g., the connection pads 511 of FIG. 5). The connection pads 811 can be conductive, e.g., made of metal such as copper.

The first array stack 820a can be similar to the array structure 520 of FIG. 5. The first array stack 820a includes a memory array 830a (e.g., the memory array 530 of FIG. 5) and an array circuit 840a. Similar to the array circuit 540 of FIG. 5, the array circuit 840a includes a semiconductor substrate 842a and an array-side integrated circuit 844a (e.g., the array-side integrated circuit 544 of FIG. 5) formed on the semiconductor substrate 842a. The semiconductor substrate 842a includes first and second opposite sides. The array-side integrated circuit 844a can be formed in the first side of the semiconductor substrate 842a, and the memory array 830a can be formed on the array-side integrated circuit 844a.

Different from the array circuit 540 of FIG. 5, the array circuit 840a includes an interconnection structure 846a formed on the second side of the semiconductor substrate 842a configured for the integration and conductively coupling between the first array stack 820a and the second array stack 820b. In some embodiments, e.g., as illustrated in FIG. 8, the interconnection structure 846a includes a dielectric layer 847a (e.g., made of a dielectric material) with a series of conducive pads 848a (e.g., made of metal such as W) within the dielectric layer 847a. The interconnection structure 846a further includes a top layer 843a (e.g., the top layer 513 or 523 of FIG. 5) having a series of connection pads 841a (e.g., the connection pads 511 or 521 of FIG. 5). Thus, the device-side integrated circuit 814 can be conductively coupled to the array-side integrated circuit 844a by corresponding integrated connection pads 811, 821a, one or more TACs 824a (e.g., the second TAC 524-1 or 524-2 of FIG. 5), one or more conductive VIAs 829a (e.g., the conductive VIAs 529a, 529b of FIG. 5). The device-side integrated circuit 814 can be conductively coupled to the one or more connection pads 814a by corresponding integrated connection pads 811, 821a, one or more TACs 822a (e.g., the third TAC 522-1 or 522-2 of FIG. 5), one or more conductive VIAs 845a (through the semiconductor substrate 842a), and one or more conductive pads 848a.

The second array stack 820b can be similar to, or same as, the array-side structure 520 of FIG. 5. A combination of the second array stack 820b and the I/O structure 850 can be same as the combination of the array-side structure 520 and the I/O structure 550 of FIG. 5. The second array stack 820b includes a memory array 830b (e.g., the memory array 530 of FIG. 5) and an array circuit 840b (e.g., the array circuit 540 of FIG. 5). The array circuit 840b includes an array-side integrated circuit 844b (e.g., the array-side integrated circuit 544 of FIG. 5) formed on a semiconductor substrate 842b. The second array stack 820b has a top layer 823b (e.g., the top layer 523 of FIG. 5) having a plurality of connection pads 821b (e.g., the connection pads 521 of FIG. 5). The first array stack 820a and the second array stack 820b can be integrated together, e.g., by aligning and bonding the connection pads 821b and the connection pad 841a.

The semiconductor substrate 842b includes first and second opposite sides. The array-side integrated circuit 844b can be formed in the first side of the semiconductor substrate 842b, and the memory array 830b can be formed on the array-side integrated circuit 844b. The I/O structure 850 can be formed on the second side of the semiconductor substrate 842b. The I/O structure 850 can be similar to, or same as, the I/O structure 550 of FIG. 5. In some embodiments, the I/O structure 850 includes a first layer 852 (e.g., the first layer 552 of FIG. 5) on the second side of the semiconductor substrate 842, a series of conductive pads 854 (e.g., the conductive pads 554 of FIG. 5) formed on the first layer 852, and a passivation or protective layer 856.

In some embodiments, the device-side integrated circuit 814 can be conductively coupled to the array-side integrated circuit 844b by corresponding integrated connection pads 811, 821a, one or more TACs 822a, one or more conductive VIAs 829a, one or more conductive VIAs 845a, corresponding integrated connection pads 841a, 821b, and one or more TACs 824b (e.g., the second TACs 524-1 or 524-2 of FIG. 5).

In some embodiments, the device-side integrated circuit 814 can be conductively coupled to one or more external devices (e.g., a controller or a power source) by the one or more conductive pads 854. The device-side integrated circuit 814 can be conductively coupled to the one or more conductive pads 854 by corresponding integrated connection pads 811, 821a, one or more TACs 822a, one or more conductive VIAs 829a, one or more conductive VIAs 845a, corresponding integrated connection pads 841a, 821b, one or more TACs 822b (e.g., the third TACs 522-1 or 522-2 of FIG. 5), and one or more conductive VIAs 845b (through the semiconductor substrate 842b). In such a way, each of the first array stack 820a and the second array stack 820b can be independently conductively coupled to the device-side integrated circuit 814, and the device-sided integrated circuit 814 can be conductively coupled to the one or more external devices using conductive contact through the first array stack 820a and the second array stack 820b.

In some embodiments, an I/O structure can be formed on a bottom side of the semiconductor substrate 812, opposite to the device-side integrated circuit 814 formed on a front side of the semiconductor substrate 812. The I/O structure can be used to replace the I/O structure 850 or supplemental to the I/O structure 850. In such a way, the device-side integrated circuit 814 may be conductively coupled to one or more external devices through less routing/path than the integrated 3D memory chip 800 having the I/O structure 850 on top of the array stacks 820a, 820b, which may improve a data transfer speed.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A semiconductor device comprising:
    an array-side structure comprising:
        a memory array of memory cells, and
        an array-side integrated circuit conductively coupled to the memory array; and
    a device-side structure comprising a device-side integrated circuit, wherein the array-side structure and the device-side structure are integrated together with one or more connection pads therebetween, and wherein the array-side integrated circuit and the device-side integrated circuit are conductively coupled to each other through at least one of the one or more connection pads and configured to perform one or more operations on the memory array.

2. The semiconductor device of claim 1, wherein the one or more operations comprise one or more of a write operation, a read operation, a programming operation, an erasing operation, and a search operation.

3. The semiconductor device of claim 1, wherein the array-side integrated circuit comprises one or more first logics or circuits, and the device-side integrated circuit comprises one or more second logics or circuits having at least one of a higher operation speed or a higher thermal sensitivity than the one or more first logics or circuits.

4. The semiconductor device of claim 1, wherein the array-side integrated circuit comprises one or more first logics or circuits configured for one or more local operations on the memory array, and
wherein the device-side integrated circuit comprises one or more second logics or circuits configured for at least one of one or more global operations for the semiconductor device or communication with one or more external devices.

5. The semiconductor device of claim 1, wherein the array-side integrated circuit comprises at least one of a core control logic, a sense amplifier or a page buffer circuit, a word line decoder, or a high voltage charge pump, and
wherein the device-side integrated circuit comprises at least one of a main control logic, a data buffer, a cache, a clock generator, a data path, an input/output (I/O) circuit, a computer-in-memory (CIM) logic, or one or more peripheral circuits.

6. The semiconductor device of claim 1, comprising a first semiconductor chip including the array-side structure and a second semiconductor chip including the device-side structure,
wherein the first semiconductor chip has a first layer comprising first bonding pads, and the second semiconductor chip has a second layer comprising second bonding pads, and
wherein the first semiconductor chip and the second semiconductor chip are bonded together by the first bonding pads in the first layer bonded with the second bonding pads in the second layer, the bonded first bonding pads and second bonding pads comprising the one or more connection pads.

7. The semiconductor device of claim 6, wherein each of the first semiconductor chip and the second semiconductor chip is a CMOS chip, and
wherein the first semiconductor chip is formed by a CMOS under array (CuA) process, and the first semiconductor chip and the second semiconductor chip are integrated together by a CMOS bonding Array (CbA) process.

8. The semiconductor device of claim 1, wherein the memory array comprises:
a three-dimensional (3D) array structure comprising:
a plurality of conductive layers separated from each other by insulating layers, and
a plurality of vertical channels being arranged orthogonally through the plurality of conductive layers and the insulating layers, each of the plurality of vertical channels comprising a string of memory cells;
a stepped structure configured to individually expose the plurality of conductive layers; and
a plurality of conductive channels through the stepped structure, wherein each of the plurality of conductive layers is configured to be conductively connected to the array-side integrated circuit by a corresponding conductive channel of the plurality of conductive channels.

9. The semiconductor device of claim 8, wherein the array-side integrated circuit comprises:
a word line decoder, and
a core control logic conductively coupled to the word line decoder,
wherein the memory array further comprises:
one or more first through array contacts (TACs) through the memory array having a first TAC conductively coupled between the word line decoder and the plurality of conductive channels, and
one or more second through array contacts (TACs) through the memory array having a second TAC conductively coupled between the core control logic and a main control logic in the device-side integrated circuit.

10. The semiconductor device of claim 9, wherein the memory array further comprises:
one or more common source layers on a first side of the 3D array structure; and
a plurality of bit lines on a second side of the 3D array structure,
wherein the array-side integrated circuit is formed adjacent to the one or more common source layers on the first side of the 3D array structure, and the device-side integrated circuit is formed adjacent to the plurality of bit lines on the second side of the 3D array structure, and
wherein the array-side integrated circuit comprises a sense amplifier or a page buffer circuit conductively coupled to the plurality of bit lines through another second TAC of the one or more second TACs.

11. The semiconductor device of claim 9, wherein the 3D array structure comprises a first subarray structure and a second subarray structure with the stepped structure therebetween, and
wherein the word line decoder is arranged on top of the stepped structure and between the first subarray structure and the second subarray structure.

12. The semiconductor device of claim 9, wherein the array-side integrated circuit further comprises:
a sense amplifier or a page buffer circuit conductively coupled to the memory array and the core control logic, and
a high voltage charge pump conductively coupled to the core control logic, and
wherein the sense amplifier or the page buffer circuit, the core control logic, and the high voltage charge pump are arranged on top of the 3D array structure.

13. The semiconductor device of claim 9, wherein the 3D array structure further comprises: a plurality of dielectric layers extending from the plurality of conductive layers and being separated by the insulating layers,
wherein the one or more second TACs are through the plurality of dielectric layers and the insulating layers, and
wherein the memory array further comprises one or more third TACs through the plurality of dielectric layers and the insulating layers and configured to conductively couple the device-side integrated circuit to one or more input/output (I/O) conductive pads for connection with at least one of an external controller or an external power source.

14. The semiconductor device of claim 1, wherein the array-side structure comprises a first semiconductor substrate, and the array-side integrated circuit is formed on a first side of the first semiconductor substrate and the memory array is formed on the array-side integrated circuit,
wherein the device-side structure comprises a second semiconductor substrate, and the device-side integrated circuit is formed on the second semiconductor substrate, and
wherein the one or more connection pads are between the device-side integrated circuit and the memory array.

15. The semiconductor device of claim 14, further comprising one or more input/output (I/O) conductive pads formed on a second side of the first semiconductor substrate, the second side being opposite to the first side, and
wherein the device-side integrated circuit is conductively coupled to the one or more I/O conductive pads through a conductive via through the first semiconductor substrate and a through-array contact (TAC) through the memory array.

16. The semiconductor device of claim 1, comprising a plurality of array-side structure including the array-side structure,
wherein the plurality of array-side structures are integrated on the device-side structure by respective connection pads, and
wherein each of the plurality of array-side structures is independently conductively coupled to the device-side integrated circuit through at least one respective connection pad.

17. The semiconductor device of claim 16, wherein a number of the plurality of array-side structures is an even number.

18. The semiconductor device of claim 16, wherein each of the plurality of array-side structures comprises a respective plane having a plurality of blocks.

19. The semiconductor device of claim 16, wherein the plurality of array-side structures are formed on a semiconductor substrate.

20. A semiconductor device comprising:
a device-side structure comprising a device-side integrated circuit extending along a first direction; and
multiple stacks of array-side structures sequentially arranged on the device-side structure along a second direction perpendicular to the first direction,
wherein each stack of the multiple stacks comprises at least one array-side structure comprising:
a memory array of memory cells, and
an array-side integrated circuit conductively coupled to the memory array, and
wherein the array-side integrated circuit is conductively coupled to the device-side integrated circuit and configured to perform one or more operations on the memory array.

21. The semiconductor device of claim 20, wherein the multiple stacks comprise:
a first stack comprising a first semiconductor substrate, a first array-side integrated circuit formed on the first semiconductor substrate, and a first memory array formed on the first array-side integrated circuit, and
a second stack comprising a second semiconductor substrate, a second array-side integrated circuit formed on the second semiconductor substrate, and a second memory array formed on the first array-side integrated circuit,
wherein the first stack is integrated with the device-side structure by one or more first bonding pads between the first memory array and the device-side integrated circuit, and
wherein the second stack is integrated with the first stack by one or more second bonding pads between the second memory array and the first semiconductor substrate.

22. The semiconductor device of claim 21, wherein the first array-side integrated circuit is conductively coupled to the device-side integrated circuit by one or more first through-array contact (TACs) through the first memory array, and
wherein the second array-side integrated circuit is conductively coupled to the device-side integrated circuit by one or more second TACs through the second memory array, a conductive via through the first semiconductor substrate, and one or more other first TACs through the first memory array.

23. The semiconductor device of claim 20, further comprising an input/output (I/O) structure on top of the multiple stacks along the second direction,
wherein the I/O structure comprises one or more input/output (I/O) conductive pads conductively coupled to the device-side integrated circuit and configured for conductive connection with at least one of an external controller or an external power source.

24. The semiconductor device of claim 23, wherein the I/O structure comprises a protective layer on top of the one or more I/O conductive pads, the protective layer being a top layer of the semiconductor device.

25. A semiconductor device comprising:
a memory device comprising one or more memory chips; and
a memory controller conductively coupled to each of the one or more memory chips,
wherein each of the one or more memory chips comprises:
an array-side structure comprising: a memory array of memory cells and an array-side integrated circuit conductively coupled to the memory array, and
a device-side structure comprising a device-side integrated circuit,
wherein the array-side structure and the device-side structure are integrated together with one or more connection pads therebetween, and
wherein the array-side integrated circuit and the device-side integrated circuit are conductively coupled to each other through at least one of the one or more connection pads and configured to perform one or more operations on the memory array.

26. The semiconductor device of claim 25, wherein each of the one or more memory chips comprises a plurality of array-side structures integrated on the device-side structure by respective conductive pads,
wherein each of the plurality of array-side structures is independently conductively coupled to the device-side integrated circuit through at least one respective conductive pad, and
wherein each of the plurality of memory chips comprises a respective input/output (I/O) interface configured for communication between the device-side integrated circuit of the memory chip and the memory controller.

\* \* \* \* \*